(12) United States Patent
Jones et al.

(10) Patent No.: US 12,218,770 B2
(45) Date of Patent: *Feb. 4, 2025

(54) TRANSMISSION OF PULSE POWER AND DATA IN A COMMUNICATIONS NETWORK

(71) Applicant: Cisco Technology, Inc., San Jose, CA (US)

(72) Inventors: Chad M. Jones, Doylestown, OH (US); Joel Richard Goergen, Soulsbyville, CA (US); George Allan Zimmerman, Manhattan Beach, CA (US); Richard Anthony O'Brien, Livermore, CA (US); Douglas Paul Arduini, San Ramon, CA (US); Jason DeWayne Potterf, Austin, TX (US); Sung Kee Baek, San Ramon, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/486,238

(22) Filed: Oct. 13, 2023

(65) Prior Publication Data

US 2024/0113903 A1 Apr. 4, 2024

Related U.S. Application Data

(63) Continuation of application No. 17/884,124, filed on Aug. 9, 2022, now Pat. No. 11,848,790, which is a
(Continued)

(51) Int. Cl.
*H04L 12/10* (2006.01)
*H03M 13/03* (2006.01)
(Continued)

(52) U.S. Cl.
CPC ............ *H04L 12/10* (2013.01); *H03M 13/03* (2013.01); *H03M 13/373* (2013.01); *H04B 3/54* (2013.01);
(Continued)

(58) Field of Classification Search
CPC ........ H04L 12/10; H04L 41/12; H03M 13/03; H04B 3/54; H04B 2203/542
See application file for complete search history.

(56) References Cited

U.S. PATENT DOCUMENTS 3,335,324 A  8/1967  Buckeridge
3,962,529 A  6/1976  Kubo
(Continued)

FOREIGN PATENT DOCUMENTS

CN  1209880 C  7/2005
CN  1815459 A  8/2006
(Continued)

OTHER PUBLICATIONS

Petition for Post Grant Review of U.S. Pat. No. 10,735,105 [Public] with Exhibits, filed Feb. 16, 2021, PGR 2021-00056, 116 Pages.
(Continued)

*Primary Examiner* — Samir W Rizk

(57) ABSTRACT

In one embodiment, a method includes transmitting pulse power on two wire pairs, the pulse power comprising a plurality of high voltage pulses with the high voltage pulses on the wire pairs offset between the wire pairs to provide continuous power, performing low voltage fault detection on each of the wire pairs between the high voltage pulses, and transmitting data on at least one of the wire pairs during transmittal of the high voltage pulses. Data transmittal is suspended during the low voltage fault detection.

20 Claims, 23 Drawing Sheets

Related U.S. Application Data continuation of application No. 16/999,754, filed on Aug. 21, 2020, now Pat. No. 11,444,791, which is a continuation of application No. 16/704,502, filed on Dec. 5, 2019, now Pat. No. 10,790,997, which is a continuation-in-part of application No. 16/255,657, filed on Jan. 23, 2019, now Pat. No. 11,061,456.

(51) Int. Cl.
 *H03M 13/37* (2006.01)
 *H04B 3/54* (2006.01)
 *H04L 41/12* (2022.01)
 *H04W 80/02* (2009.01)
 *H03M 13/15* (2006.01)

(52) U.S. Cl.
 CPC .............. *H04L 41/12* (2013.01); *H04W 80/02* (2013.01); *H03M 13/1515* (2013.01); *H04B 2203/542* (2013.01)

(56) References Cited

U.S. PATENT DOCUMENTS

| | | |
|---|---|---|
| 4,097,692 A | 6/1978 | Felix |
| 4,811,187 A | 3/1989 | Nakajima et al. |
| 4,997,388 A | 3/1991 | Dale et al. |
| 5,159,684 A | 10/1992 | Kroll et al. |
| 5,652,893 A | 7/1997 | Ben-Meir et al. |
| 6,008,631 A | 12/1999 | Johari |
| 6,220,955 B1 | 4/2001 | Posa |
| 6,259,745 B1 | 7/2001 | Chan |
| 6,295,356 B1 | 9/2001 | De Nicolo |
| 6,448,672 B1 | 9/2002 | Voegeli et al. |
| 6,636,538 B1 | 10/2003 | Stephens |
| 6,685,364 B1 | 2/2004 | Brezina et al. |
| 6,756,881 B2 | 6/2004 | Bateman et al. |
| 6,775,799 B1 | 8/2004 | Giorgetta et al. |
| 6,784,790 B1 | 8/2004 | Lester |
| 6,826,368 B1 | 11/2004 | Koren et al. |
| 6,855,881 B2 | 2/2005 | Khoshnood |
| 6,860,004 B2 | 3/2005 | Hirano et al. |
| 6,892,336 B1 | 5/2005 | Giorgetta et al. |
| 7,073,117 B1 | 7/2006 | Ireland et al. |
| 7,325,150 B2 | 1/2008 | Lehr et al. |
| 7,417,443 B2 | 8/2008 | Admon et al. |
| 7,420,355 B2 | 9/2008 | Liu et al. |
| 7,490,996 B2 | 2/2009 | Sommer |
| 7,492,059 B2 | 2/2009 | Peker et al. |
| 7,509,505 B2 | 3/2009 | Randall et al. |
| 7,519,124 B2 | 4/2009 | Oksman et al. |
| 7,564,904 B2 | 7/2009 | Isachar et al. |
| 7,566,987 B2 | 7/2009 | Black et al. |
| 7,580,469 B2 | 8/2009 | Yonesi et al. |
| 7,583,703 B2 | 9/2009 | Bowser et al. |
| 7,589,435 B2 | 9/2009 | Metsker et al. |
| 7,593,747 B1 | 9/2009 | Karam et al. |
| 7,603,570 B2 | 10/2009 | Schindler et al. |
| 7,616,465 B1 | 11/2009 | Mnciarelli |
| 7,805,657 B2 | 9/2010 | Kappler et al. |
| 7,813,646 B2 | 10/2010 | Furey |
| 7,835,389 B2 | 11/2010 | Yu et al. |
| 7,854,634 B2 | 12/2010 | Filipon et al. |
| 7,881,072 B2 | 2/2011 | DiBene, II et al. |
| 7,915,761 B1 | 3/2011 | Jones et al. |
| 7,921,307 B2 | 4/2011 | Karam et al. |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,068,937 B2 | 11/2011 | Eaves |
| 8,081,589 B1 | 12/2011 | Gilbrech et al. |
| 8,184,525 B2 | 5/2012 | Karam |
| 8,276,397 B1 | 10/2012 | Carlson et al. |
| 8,279,883 B2 | 10/2012 | Diab et al. |
| 8,310,089 B2 | 11/2012 | Schindler et al. |
| 8,319,627 B2 | 11/2012 | Chan et al. |
| 8,345,439 B1 | 1/2013 | Goergen et al. |
| 8,350,538 B2 | 1/2013 | Cuk |
| 8,358,893 B1 | 1/2013 | Sanderson et al. |
| 8,386,820 B2 | 2/2013 | Diab |
| 8,638,008 B2 | 1/2014 | Baldwin et al. |
| 8,700,923 B2 | 4/2014 | Fung |
| 8,712,324 B2 | 4/2014 | Corbridge et al. |
| 8,750,710 B1 | 6/2014 | Hirt et al. |
| 8,768,528 B2 | 7/2014 | Millar et al. |
| 8,781,637 B2 | 7/2014 | Eaves |
| 8,787,775 B2 | 7/2014 | Earnshaw |
| 8,793,511 B1 | 7/2014 | Bishara |
| 8,829,917 B1 | 9/2014 | Lo et al. |
| 8,836,228 B2 | 9/2014 | Xu et al. |
| 8,842,430 B2 | 9/2014 | Hellriegel et al. |
| 8,849,471 B2 | 9/2014 | Daniel et al. |
| 8,898,446 B2 | 11/2014 | Ronen et al. |
| 8,966,747 B2 | 3/2015 | Vinciarelli et al. |
| 8,971,399 B2 | 3/2015 | Kwon et al. |
| 9,001,881 B2 | 4/2015 | Okamura et al. |
| 9,024,473 B2 | 5/2015 | Huff et al. |
| 9,184,795 B2 | 11/2015 | Eaves |
| 9,189,043 B2 | 11/2015 | Vorenkamp et al. |
| 9,273,906 B2 | 3/2016 | Goth et al. |
| 9,319,101 B2 | 4/2016 | Lontka |
| 9,321,362 B2 | 4/2016 | Woo et al. |
| 9,373,963 B2 | 6/2016 | Kuznetsov |
| 9,419,436 B2 | 8/2016 | Eaves et al. |
| 9,467,177 B1 | 10/2016 | Dabiri |
| 9,484,771 B2 | 11/2016 | Braylovskiy et al. |
| 9,510,479 B2 | 11/2016 | Vos |
| 9,531,551 B2 | 12/2016 | Balasubramanian et al. |
| 9,590,811 B2 | 3/2017 | Hunter, Jr. et al. |
| 9,618,714 B2 | 4/2017 | Murray |
| 9,640,998 B2 | 5/2017 | Dawson |
| 9,654,253 B1 | 5/2017 | Smith et al. |
| 9,665,148 B2 | 5/2017 | Hamdi et al. |
| 9,693,244 B2 | 6/2017 | Maruhashi et al. |
| 9,734,940 B1 | 8/2017 | McNutt et al. |
| 9,768,978 B2 | 9/2017 | Coenen et al. |
| 9,819,444 B2 | 11/2017 | Shen et al. |
| 9,853,689 B2 | 12/2017 | Eaves |
| 9,874,930 B2 | 1/2018 | Vavilala et al. |
| 9,882,656 B2 | 1/2018 | Sipes, Jr. et al. |
| 9,891,678 B2 | 2/2018 | Butcher et al. |
| 9,893,521 B2 | 2/2018 | Lowe et al. |
| 9,948,198 B2 | 4/2018 | Imai |
| 9,979,370 B2 | 5/2018 | Xu |
| 9,985,600 B2 | 5/2018 | Xu et al. |
| 10,007,628 B2 | 6/2018 | Pitigoi-Aron et al. |
| 10,028,417 B2 | 7/2018 | Schmidtke et al. |
| 10,075,189 B2 | 9/2018 | Li et al. |
| 10,128,764 B1 | 11/2018 | Vinciarelli |
| 10,218,492 B2 | 2/2019 | Sengoku |
| 10,248,178 B2 | 4/2019 | Brooks et al. |
| 10,263,526 B2 | 4/2019 | Sandusky et al. |
| 10,281,513 B1 | 5/2019 | Goergen et al. |
| 10,374,813 B2 | 8/2019 | Sheffield |
| 10,407,995 B2 | 9/2019 | Moeny |
| 10,439,432 B2 | 10/2019 | Eckhardt et al. |
| 10,468,879 B2 | 11/2019 | Eaves |
| 10,541,543 B2 | 1/2020 | Eaves |
| 10,541,758 B2 | 1/2020 | Goergen et al. |
| 10,574,391 B2 | 2/2020 | Schmidtke et al. |
| 10,631,443 B2 | 4/2020 | Byers et al. |
| 10,639,587 B2 | 5/2020 | Lu |
| 10,671,146 B2 | 6/2020 | Wendt et al. |
| 10,714,930 B1 | 7/2020 | Weiss et al. |
| 10,735,105 B2 | 8/2020 | Goergen et al. |
| 10,790,997 B2 * | 9/2020 | Jones ...................... H04B 3/54 |
| 11,055,615 B2 | 7/2021 | Litichever et al. |
| 11,061,456 B2 * | 7/2021 | Jones ................... H03M 13/154 |
| 11,387,852 B2 | 7/2022 | Banin et al. |
| 11,444,791 B2 * | 9/2022 | Jones ..................... H04L 12/10 |
| 11,848,790 B2 * | 12/2023 | Jones ................... H04W 80/02 |
| 2001/0024373 A1 | 9/2001 | Cuk |

(56) References Cited

U.S. PATENT DOCUMENTS

| | | |
|---|---|---|
| 2002/0126967 A1 | 9/2002 | Panak et al. |
| 2004/0000816 A1 | 1/2004 | Khoshnood |
| 2004/0033076 A1 | 2/2004 | Song et al. |
| 2004/0043651 A1 | 3/2004 | Bain et al. |
| 2004/0073703 A1 | 4/2004 | Boucher et al. |
| 2004/0264214 A1 | 12/2004 | Xu et al. |
| 2005/0197018 A1 | 9/2005 | Lord |
| 2005/0268120 A1 | 12/2005 | Schindler et al. |
| 2006/0202109 A1 | 9/2006 | Delcher et al. |
| 2006/0209875 A1 | 9/2006 | Lum et al. |
| 2007/0103168 A1 | 5/2007 | Batten et al. |
| 2007/0143508 A1 | 6/2007 | Linnman |
| 2007/0236853 A1 | 10/2007 | Crawley |
| 2007/0263675 A1 | 11/2007 | Lum et al. |
| 2007/0284941 A1 | 12/2007 | Robbins |
| 2007/0284946 A1 | 12/2007 | Robbins |
| 2007/0288125 A1 | 12/2007 | Quaratiello |
| 2007/0288771 A1 | 12/2007 | Robbins |
| 2008/0054720 A1 | 3/2008 | Lum et al. |
| 2008/0166715 A1 | 7/2008 | Hillis et al. |
| 2008/0198635 A1 | 8/2008 | Hussain et al. |
| 2008/0229120 A1 | 9/2008 | Diab |
| 2008/0310067 A1 | 12/2008 | Diab et al. |
| 2009/0027033 A1 | 1/2009 | Diab |
| 2010/0061127 A1 | 3/2010 | Katou et al. |
| 2010/0077239 A1 | 3/2010 | Diab et al. |
| 2010/0117808 A1 | 5/2010 | Karam |
| 2010/0171602 A1 | 7/2010 | Kabbara et al. |
| 2010/0190384 A1 | 7/2010 | Lanni |
| 2010/0237846 A1 | 9/2010 | Vetteth |
| 2010/0290190 A1 | 11/2010 | Chester et al. |
| 2011/0007664 A1 | 1/2011 | Diab et al. |
| 2011/0057612 A1 | 3/2011 | Taguchi et al. |
| 2011/0083824 A1 | 4/2011 | Rogers |
| 2011/0228578 A1 | 9/2011 | Serpa et al. |
| 2011/0266867 A1 | 11/2011 | Schindler et al. |
| 2011/0290497 A1 | 12/2011 | Stenevik |
| 2012/0043935 A1 | 2/2012 | Dyer et al. |
| 2012/0064745 A1 | 3/2012 | Ottliczky |
| 2012/0170927 A1 | 7/2012 | Huang et al. |
| 2012/0201089 A1 | 8/2012 | Barth et al. |
| 2012/0231654 A1 | 9/2012 | Conrad |
| 2012/0287984 A1 | 11/2012 | Lee |
| 2012/0317426 A1 | 12/2012 | Hunter, Jr. et al. |
| 2012/0319468 A1 | 12/2012 | Schneider et al. |
| 2013/0077923 A1 | 3/2013 | Peeters Weem et al. |
| 2013/0079633 A1 | 3/2013 | Peeters Weem et al. |
| 2013/0103220 A1 | 4/2013 | Eaves |
| 2013/0249292 A1 | 9/2013 | Blackwell, Jr. et al. |
| 2013/0272721 A1 | 10/2013 | Van Veen et al. |
| 2013/0329344 A1 | 12/2013 | Tucker et al. |
| 2014/0111180 A1 | 4/2014 | Vladan et al. |
| 2014/0126151 A1 | 5/2014 | Campbell et al. |
| 2014/0129850 A1 | 5/2014 | Paul |
| 2014/0258742 A1 | 9/2014 | Chien et al. |
| 2014/0258813 A1 | 9/2014 | Lusted et al. |
| 2014/0265550 A1 | 9/2014 | Milligan et al. |
| 2014/0372773 A1 | 12/2014 | Heath et al. |
| 2015/0009050 A1 | 1/2015 | Lahr et al. |
| 2015/0078740 A1 | 3/2015 | Sipes, Jr. et al. |
| 2015/0106539 A1 | 4/2015 | Leinonen et al. |
| 2015/0115741 A1 | 4/2015 | Dawson |
| 2015/0207317 A1 | 7/2015 | Radermacher et al. |
| 2015/0215001 A1 | 7/2015 | Eaves |
| 2015/0215131 A1 | 7/2015 | Paul et al. |
| 2015/0333918 A1 | 11/2015 | White, III |
| 2015/0365003 A1 | 12/2015 | Sadwick |
| 2016/0018252 A1 | 1/2016 | Hanson et al. |
| 2016/0020911 A1 | 1/2016 | Sipes, Jr. et al. |
| 2016/0064938 A1 | 3/2016 | Balasubramanian et al. |
| 2016/0111877 A1 | 4/2016 | Eaves et al. |
| 2016/0118784 A1 | 4/2016 | Saxena et al. |
| 2016/0133355 A1 | 5/2016 | Glew et al. |
| 2016/0134331 A1 | 5/2016 | Eaves |
| 2016/0142217 A1 | 5/2016 | Gardner et al. |
| 2016/0188427 A1 | 6/2016 | Chandrashekar et al. |
| 2016/0197600 A1 | 7/2016 | Kuznetsov |
| 2016/0241148 A1 | 8/2016 | Kizilyalli et al. |
| 2016/0262288 A1 | 9/2016 | Chainer et al. |
| 2016/0269195 A1 | 9/2016 | Coenen et al. |
| 2016/0273722 A1 | 9/2016 | Crenshaw |
| 2016/0294500 A1 | 10/2016 | Chawgo et al. |
| 2016/0294568 A1 | 10/2016 | Chawgo et al. |
| 2016/0308683 A1 | 10/2016 | Pischl et al. |
| 2016/0337079 A1 | 11/2016 | Ran |
| 2016/0352535 A1 | 12/2016 | Hiscock et al. |
| 2016/0365967 A1 | 12/2016 | Tu et al. |
| 2017/0041152 A1 | 2/2017 | Sheffield |
| 2017/0041153 A1 | 2/2017 | Picard et al. |
| 2017/0054296 A1 | 2/2017 | Daniel et al. |
| 2017/0110871 A1 | 4/2017 | Foster |
| 2017/0123466 A1 | 5/2017 | Carnevale |
| 2017/0146260 A1 | 5/2017 | Ribbich et al. |
| 2017/0155517 A1 | 6/2017 | Cao |
| 2017/0155518 A1 | 6/2017 | Yang |
| 2017/0164525 A1 | 6/2017 | Chapel et al. |
| 2017/0214236 A1 | 7/2017 | Eaves |
| 2017/0229886 A1 | 8/2017 | Eaves |
| 2017/0234738 A1 | 8/2017 | Ross et al. |
| 2017/0248976 A1 | 8/2017 | Møller et al. |
| 2017/0294966 A1 | 10/2017 | Jia et al. |
| 2017/0325320 A1 | 11/2017 | Wendt et al. |
| 2018/0024964 A1 | 1/2018 | Mao et al. |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello et al. |
| 2018/0102604 A1 | 4/2018 | Keith et al. |
| 2018/0123360 A1 | 5/2018 | Eaves |
| 2018/0188712 A1 | 7/2018 | Mackay |
| 2018/0191513 A1 | 7/2018 | Hess et al. |
| 2018/0254624 A1 | 9/2018 | Son |
| 2018/0313886 A1 | 11/2018 | Mlyniec et al. |
| 2018/0340840 A1 | 11/2018 | Bullock et al. |
| 2019/0064890 A1 | 2/2019 | Donachy et al. |
| 2019/0097457 A1 | 3/2019 | Hazani |
| 2019/0126764 A1 | 5/2019 | Fuhrer |
| 2019/0267804 A1 | 8/2019 | Matan et al. |
| 2019/0272011 A1 | 9/2019 | Goergen et al. |
| 2019/0277899 A1 | 9/2019 | Goergen et al. |
| 2019/0277900 A1 | 9/2019 | Goergen et al. |
| 2019/0278347 A1 | 9/2019 | Goergen et al. |
| 2019/0280895 A1 | 9/2019 | Mather et al. |
| 2019/0304630 A1 | 10/2019 | Goergen et al. |
| 2019/0312751 A1 | 10/2019 | Goergen et al. |
| 2019/0342011 A1 | 11/2019 | Goergen et al. |
| 2019/0363493 A1 | 11/2019 | Sironi et al. |
| 2020/0044751 A1 | 2/2020 | Goergen et al. |
| 2020/0228001 A1 | 7/2020 | Lambert et al. |
| 2020/0295955 A1 | 9/2020 | O'Brien et al. |
| 2022/0190587 A1 | 6/2022 | Eaves et al. |

FOREIGN PATENT DOCUMENTS

| | | |
|---|---|---|
| CN | 101026523 A | 8/2007 |
| CN | 201689347 U | 12/2010 |
| CN | 102142932 A | 8/2011 |
| CN | 104412541 A | 3/2015 |
| CN | 104584481 A | 4/2015 |
| CN | 204836199 U | 12/2015 |
| CN | 205544597 U | 8/2016 |
| CN | 104081237 B | 10/2016 |
| CN | 104412541 B | 5/2019 |
| EP | 1936861 A1 | 6/2008 |
| EP | 2120443 A1 | 11/2009 |
| EP | 2257009 A2 | 12/2010 |
| EP | 2432134 A1 | 3/2012 |
| EP | 2693688 A1 | 2/2014 |
| WO | 9316407 A1 | 8/1993 |
| WO | 2006127916 A2 | 11/2006 |
| WO | 2010053542 A2 | 5/2010 |
| WO | 2014011224 A1 | 1/2014 |
| WO | 2017054030 A1 | 4/2017 |

(56) References Cited

FOREIGN PATENT DOCUMENTS

| WO | 2017167926 A1 | 10/2017 |
|---|---|---|
| WO | 2018017544 A1 | 1/2018 |
| WO | 2019023731 A1 | 2/2019 |
| WO | 2019212759 A1 | 11/2019 |
| WO | 2020154101 A1 | 7/2020 |
| WO | 2020154103 A1 | 7/2020 |
| WO | 2022081778 A1 | 4/2022 |

OTHER PUBLICATIONS

Pluribus Networks, "Pluribus VirtualWire Solution," Product Overview, PN-PO-VWS-05818, URL: https://www.pluribusnetworks.com/assets/Pluribus-VirtualWire-PO-50918.pdf, May 2018, 5 pages.
Sedra, A.S., "Microelectronic Circuits," Oxford, Seventh Edition, Nov. 14, 2014, 38 Pages.
Stallings, W., "Data and Computer Communications," Macmillan Publishing Company, Fourth Edition, Jan. 1, 1994, 14 Pages.
Stran Technologies, "TFOCA GenX Hybrid 2x2 Fiber Optic—Copper Connector," Contact Strantech, Retrieved From URL: https://www.strantech.com/products/tfoca-genx-hybrid-2x2-fiber-optic-copper-connector/, Dec. 2017, 2 pages.
Tanenbaum, A.S., "Computer Networks," Prentice Hall PTR, Third Edition, Mar. 1996, 12 Pages.
*Voltserver Inc.*, v. *Cisco Systems, Inc.*, "Patent Owner's Preliminary Response to Post Grant Review under 35 U.S.C. 312 and 37 C.F.R. 42.107," United States Patent and Trademark Office, PGR2021-00056, U.S. Pat. No. 10,735,105, 2021, Jun. 2, 2021, 46 pages.
*Voltserver Inc.*, v. *Cisco Systems, Inc.*, "Patent Owners Preliminary Response to Post Grant Review under 35 U.S.C. 312 and 37 C.F.R. 42.107," United States Patent and Trademark Office, PGR2021-00055, U.S. Pat. No. 10,735,105, 2021, Jun. 2, 2021, 51 pages.
*Voltserver Inc.*, v. *Cisco Technology, Inc.*, "Decision Denying Institution of Post-Grant Review," United States Patent and Trademark Office, PGR2021-00055, U.S. Pat. No. 10,735,105 B2, Aug. 19, 2021, 25 pages.
*Voltserver Inc.*, v. *Cisco Technology, Inc.*, "Decision Denying Institution of Post-Grant Review," United States Patent and Trademark Office, PGR2021-00056, U.S. Pat. No. 10,735,105 B2, Aug. 23, 2021, 18 pages.
*Voltserver Inc.*, v. *Cisco Technology, Inc.*, "Declaration of David A. Durfee, Ph.D.," United States Patent and Trademark Office, PGR2021-00055, U.S. Pat. No. 10,735, 105, Feb. 16, 2021, 340 pages.
*Voltserver Inc.*, v. *Cisco Technology, Inc.*, "Declaration of Stephens S. Eaves," United States Patent and Trademark Office, PGR2021-00056, U.S. Pat. No. 10,735,105, Feb. 16, 2021, 7 pages.
Yencheck M.R., et al., "Thermal Modeling of Portable Power Cables," RI9463, Jan. 1993, 19 pages.
Zhang K., et al., "Machine Learning-Based Temperature Prediction for Runtime Thermal Management across System Components," IEEE Transactions on Parallel and Distribute, Mar. 2016, 15 pages.
Adapa, R., "Dynamic Thermal Rating of Substation Terminal Equipment," CIGRE, Jan. 2004, 8 Pages.
Alexander, C.K., et al., "Fundamentals of Electric Circuits," McGraw Hill Education, Indian Edition 5e, 2013, 37 pages.
Audio/video, Information and Communication Technology Equipment- Part 1: Safety requirements, International Standard, IEC 62368-1, Edition 2.0, ISBN 978-2-8322-1405-3, Feb. 2014, 680 Pages.
Berkeley Lab ETA, "Touch-Safe, High Voltage Digital Electricity Transmission Using Packet Energy Transfer," Vimeo, https://vimeo.com/172469008, Mar. 8, 2016, 8 pages.
Chen, H., et al., "Real-Time Temperature Estimation for Power MOSEFETs Considering Thermal Aging Effects," IEEE Transactions on Device and Materials Reliability, vol. 14, No. 1, Mar. 2014, 9 pages.
Jingquan, C., et al., "Buck-boost PWM Converters having Two Independently Controlled Switches," 32nd Annual IEEE Power Electronics Specialists Conference, PESC 2001, Conference Proceedings, Vancouver, Canada, New York, NY: IEEE, US, Jun. 17-21, 2001, vol. 2, pp. 736-741, DOI: 10.1109/PESC.2001.954206, ISBN 978-0-7803-7067-8, XP010559317.
Cheng, K.W.E., et al., "Constant Frequency, Two-Stage Quasiresonant Convertor," Published in: IEE Proceedings B—Electric Power Applications, vol. 139, No. 3, XP000292493, May 1, 1992, pp. 227-237.
Rabe, et al., "Data Center Power Equipment Thermal Guidelines and Best Practices," ASHRAE Technical Committee (TC) 9.9 Mission Critical Facilities, Data Centers, Technology Spaces, and Electronic Equipment, Jun. 2016, 60 pages.
"Digital Electricity Gen2 Detailed Installation Manual," Voltserver Digital Electricity, Rev B.1, Nov. 29, 2017, 68 Pages.
Durfee D.A., "Curriculum Vitae," 4 pages.
Eaves, et al., "Network Remote Power Using Packet Energy Transfer," URL: www.voltserver.com, Sep. 2012, 4 Pages.
Eaves, et al., "Network Remote Powering Using Packet Energy Transfer," Proceedings of IEEE International Conference on Telecommunications Energy (INTELEC), Sep. 30, 2012-Oct. 4, 2012, Scottsdale, AZ, 5 Pages.
Edelstein, S., "Updated 2016 Tesla Model S also Gets New 75-kWh Battery Option," Voltserver Exhibit 1018, May 5, 2016, Archived on Jun. 19, 2016 by Internet Archive Wayback machine at https://web.archive.org/web/20160619001148/https://www.greencarreports.com/news/1103782_updated-2016-tesla-model-s-also-gets-new-75-kwh-battery-option ("Edelstein"), 3 Pages.
"Effects of Current on Human Beings and Livestok—Part 1: General Aspects," Technical Specification, Basic Safety Publication, IEC/TS 60479-1, Edition 4.0, Jul. 2005, 122 pages.
"Electrical—Computer Conference Proceedings," Internet Archive WayBack Machine Search for Intelec 2012, Curran Associates, Inc., http://www.proceedings.com/electrical-computer-proceedings.html, 2012, 125 pages.
"E-Link Hybrid Connector—QPC Fiber Optic," QPC Engineered Fiber Optic Solutions, Retrieved from URL: http://www.qpcfiber.com/product/connectors/e-link-hybrid-connector/., retrieved on Dec. 21, 2017, 4 pages.
English Translation of Office Action in Counterpart Chinese Application No. 202080010019.8, mailed Mar. 3, 2022, 11 Pages.
English Translation of Office Action in Counterpart Chinese Application No. 202080010020.0, mailed Mar. 3, 2022, 15 Pages.
Examination Report in counterpart Indian Application No. 202127029265, mailed May 1, 2023, 5 pages.
Examination Report in counterpart Indian Application No. 202147024800, mailed Jan. 11, 2023, 6 Pages.
Fisher Connectors SA, "FiberOptic Cable and Connector Solutions," Retrieved from URL: https://www.fischerconnectors.com/us/en/products/fiberoptic, on Dec. 21, 2017, 5 pages.
Google, "Data Power Pulse Transition Edge Suspended Patents," retrieved May 12, 2022, 3 pages.
Google, "Data Pulses Transition Multiphase Patents," Jan. 19, 2022, 3 pages.
Google, "Transmitting Power Voltage Pulses Sequence Alternating On-time Off-time Transition Low-state High-state Superimposing Modulated Data Patents," Jan. 18, 2022, 3 pages.
Hall, S.H., et al., "High-Speed Digital System Design, A Handbook of Interconnect Theory and Design Practices," Voltserver Exhibit 1030, Aug. 25, 2000, 55 Pages.
Information Technology Equipment- Safety- Part 1: General Requirements, International Standard, IEC 60950-1, Edition 2.2, May 2013, 648 pages, ISBN 978-2-8322-0820-5.
International Preliminary Report on Patentability in Counterpart International Application No. PCT/US2020/020359, mailed Sep. 23, 2021, 9 Pages.
International Search Report and Written Opinion in Counterpart International Application No. PCT/US2020/020359, mailed May 27, 2020, 10 Pages.
International Preliminary Report on Patentability for International Application No. PCT/US2020/012758, mailed Aug. 5, 2021, 10 Pages.
International Preliminary Report on Patentability for International Application No. PCT/US2020/012801, mailed Aug. 5, 2021, 9 Pages.

(56) References Cited

OTHER PUBLICATIONS

International Search Report and Written Opinion for International Application No. PCT/US2020/012758, mailed Apr. 8, 2020, 11 Pages.

International Search Report and Written Opinion for International Application No. PCT/US2020/012801, mailed Apr. 15, 2020, 10 Pages.

"International Telecommunications Energy Conference: [proceedings] (Full Record)," Library Catalog, https://catalog.oc.gov/vwebv/holdingsInfo?searchId=3810&recPointer=O&recCount=25&searchType=1&bibId=11348322, retrieved from the Internet Feb. 12, 2021, 3 pages.

"International Telecommunications Energy Conference: [proceedings] (Marc Tags)," Library Catalog, https://catalog.loc.gov/vwebv/staffView?searchId=3877&recPointer=O&recCount=25&searchType=1&bibId=11348322, retrieved from the Internet Feb. 12, 2021, 3 pages.

Implementation Guide, "Virtual Chassis Technology Best Practices," Juniper Networks, 8010018-009-EN, Jan. 2016, URL: https://wwwjuniper.net/us/en/local/pdf/implementation-guides/8010018-en.pdf, 29 pages.

Lathi B.P., et al., "Modern Digital and Analog Communication Systems," Fourth Edition, Jan. 23, 2009, 15 pages.

LC Catalog-Browse, https://catalog.loc.gov/vwebv/searchBrowse, retrieved from the Internet Feb. 12, 2021, 1 page.

"Low-voltage Switchgear and Controlgear- Part 1: General Rules," International Standard, Amendment 2, IEC 60947-1, Edition 5.0, Sep. 2014, 106 Pages, ISBN 978-2-8322-1798-6.

Lumentum, "Power Over Fiber," Retrieved from URL: https://www.lumentum.com/sites/default/files/technical-library-items/poweroverfiber-tn-pv-ae_0.pdf, Sep. 25, 2020, 8 pages.

"Understanding 802.3at PoE Plus Standard Increases Available Power," Microsemi, Voltserver Exhibit 1033, Jun. 2011, 7 pages.

NFPA 70, "National Electrical Code," National Fire Protection Association, Voltserver Exhibit 1019, retrieved Dec. 2017, Edition ("NEC"), 881 Pages.

Palm Intranet, "Inventor Name Search Result—Chad Jones," May 12, 2022, 3 pages.

Palm Intranet, "Inventor Name Search Result—Douglas Arduini," May 12, 2022, 2 pages.

Palm Intranet, "Inventor Name Search Result—George Zimmerman," May 12, 2022, 2 pages.

Palm Intranet, "Inventor Name Search Result—Joel Goergen," May 12, 2022, 3 pages.

Palm Intranet, "Inventor Name Search Result—Richard O'Brien," May 12, 2022, 3 pages.

Palm Intranet, "Inventor Name Search Result—Sung Baek," May 12, 2022, 3 pages.

Palm Intranet, "Inventor Name Search Result—Jason Potterf," May 12, 2022, 1 page.

"Part VII: A Summary of Commonly Used MARC 21 Fields," MARC, Understanding MARC, https://www.loc.gov/marc//Umb/um07to10.html, retrieved from Internet Feb. 13, 2021, 17 pages.

*Voltserver Inc.*, v. *Cisco Technology, Inc.*, "Petition for Post Grant Review of U.S. Pat. No. 10,735,105" United States Patent and Trademark Office, PGR 2021-00055, U.S. Pat. No. 10,735,102, Feb. 16, 2021, 132 Pages.

\* cited by examiner

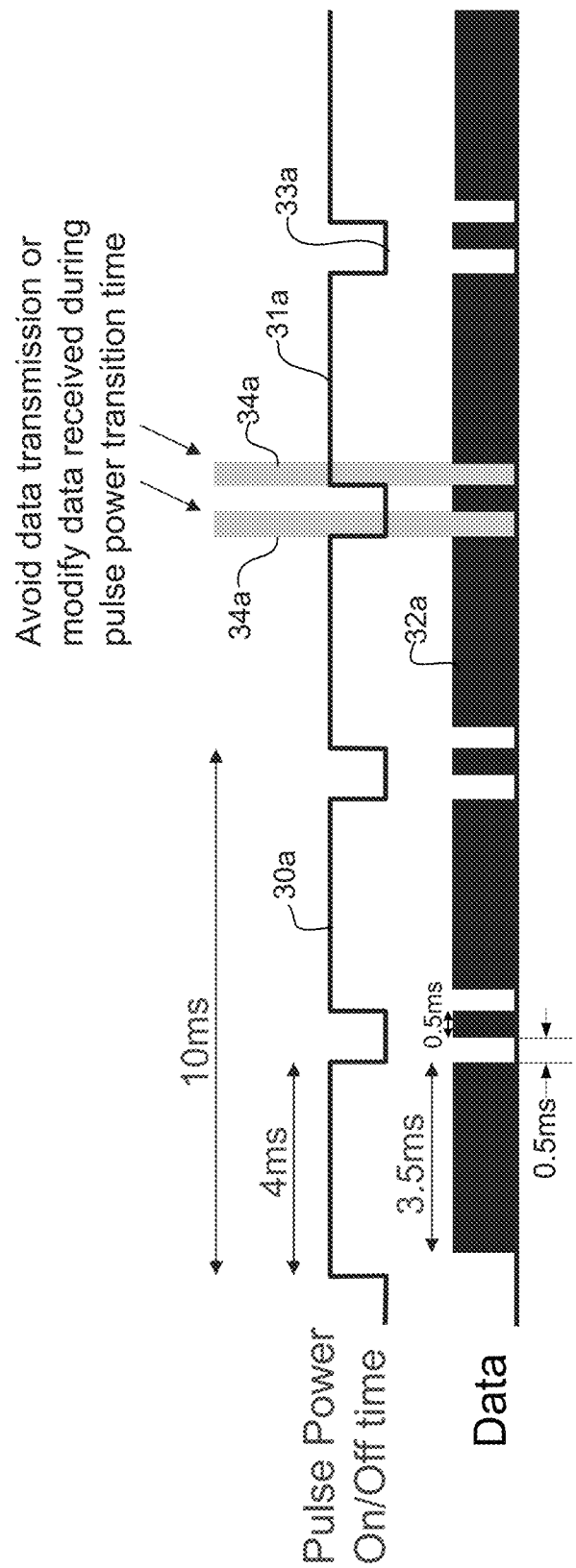

# TRANSMISSION OF PULSE POWER AND DATA IN A COMMUNICATIONS NETWORK

STATEMENT OF RELATED APPLICATIONS

The present application is a continuation of U.S. patent application Ser. No. 17/884,124, filed Aug. 9, 2022, entitled "TRANSMISSION OF PULSE POWER AND DATA IN A COMMUNICATIONS NETWORK," which in turn is a divisional of U.S. patent application Ser. No. 16/999,754, filed Aug. 21, 2020, entitled "TRANSMISSION OF PULSE POWER AND DATA IN A COMMUNICATIONS NETWORK," now U.S. Pat. No. 11,444,791, which in turn is a continuation of U.S. patent application Ser. No. 16/704,502, entitled TRANSMISSION OF PULSE POWER AND DATA IN A COMMUNICATIONS NETWORK, filed on Dec. 5, 2019, now U.S. Pat. No. 10,790,997, issued Sep. 29, 2020, which is a continuation-in-part of U.S. patent application Ser. No. 16/255,657, entitled TRANSMISSION OF PULSE POWER AND DATA OVER A WIRE PAIR, filed on Jan. 23, 2019, now U.S. Pat. No. 11,061,456, issued Jul. 13, 2021, which are incorporated herein by reference in their entirety.

TECHNICAL FIELD

The present disclosure relates generally to network communications systems, and more particularly, to transmission of power and data in a network communications system.

BACKGROUND

Power over Ethernet (PoE) is a technology for providing electrical power over a wired telecommunications network from power sourcing equipment (PSE) to a powered device (PD) over a link section. Single Pair Ethernet (SPE) enables data transmission over Ethernet via a single pair of wires while also providing a power supply to pass electrical power along with data (Power over Data Line (PoDL)). Today's PoE and PoDL systems have limited power capacity, which may be inadequate for many classes of devices.

BRIEF DESCRIPTION OF THE DRAWINGS

FIG. 3A illustrates an example of pulse power and data transmission over a wire pair with avoidance of data transmission during pulse power transition times.

Corresponding reference characters indicate corresponding parts throughout the several views of the drawings.

DESCRIPTION OF EXAMPLE EMBODIMENTS

Overview

Figure 1:
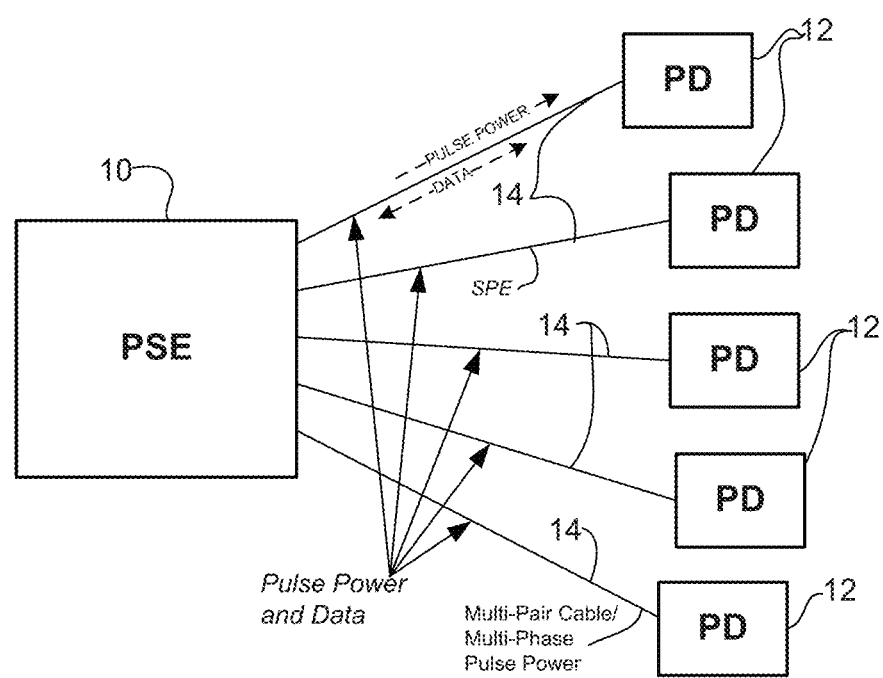
FIG. 1 illustrates an example of a network in which embodiments described herein may be implemented.

In one embodiment, a method generally comprises transmitting data on two wire pairs carrying pulse power, wherein the pulse power comprises a plurality of voltage pulses with the voltage pulses on the wire pairs offset between the wire pairs to provide continuous power and identifying transitions between at least one of a pulse-on time and a pulse-off time, and a pulse-off time and a pulse-on time on at least one of the wire pairs. Data transmission on the wire pair is controlled during the identified transitions on the wire pair to prevent interference between the pulse power and the data.

In one or more embodiments, a phase of pulse power is carried on each of the wire pairs and the wire pairs are located in a multi-pair cable.

In one or more embodiments, a voltage of the pulse power during the pulse-on time comprises at least 60 volts.

In one or more embodiments, a voltage of the pulse power during the pulse-off time is greater than zero.

In one or more embodiments, the pulse-on time of the voltage pulses overlap between the wire pairs.

In one or more embodiments, one period of the pulse-on time and the pulse-off time is less than or equal to 12 ms.

In one or more embodiments, the method further comprises performing fault detection during the pulse-off time.

In one or more embodiments, the data is transmitted during the pulse-on time and the pulse-off time.

In one or more embodiments, control of the data transmission comprises suspending the data transmission during the identified transitions.

In one or more embodiments, control of the data transmission comprises controlling a MAC (Media Access Control)/PHY (Physical layer entity) to hold off the data transmission during the identified transitions.

In one or more embodiments, control of the data transmission comprises applying Forward Error Correction (FEC) to the data for use at the receiver during the identified transitions.

In another embodiment, a method generally comprises receiving data on two wire pairs carrying pulse power, wherein the pulse power comprises a plurality of voltage pulses with the voltage pulses on the wire pairs offset between the wire pairs to provide continuous power, identifying transitions between at least one of a pulse-on time and a pulse-off time, and a pulse-off time and a pulse-on time on at least one of the wire pairs, and controlling the data on the wire pair during the identified transitions on the wire pair to prevent interference between the pulse power and the data.

In one or more embodiments, the method further comprises transmitting data on the two wire pairs.

In one or more embodiments, controlling the data comprises marking the data received during the identified transitions. In one or more embodiments, at least a portion of the marked data is dropped or retransmitted.

In one or more embodiments, Forward Error Correction (FEC) is applied to the data at a transmitter and controlling the data comprises marking the data for decoding during the identified transitions.

In one or more embodiments, the method further comprises decoding encoded modulation of the pulse power for control plane data.

In another embodiment, an apparatus generally comprises an interface for transmitting data on at least two wire pairs carrying pulse power, wherein the pulse power comprises a plurality of voltage pulses and a controller for identifying transitions between at least one of a pulse-on time and a pulse-off time, and a pulse-off time and a pulse-on time on at least one of the wire pairs and suspending data transmission on the wire pair during the identified transitions on the wire pair to prevent interference between the pulse power and the data.

In yet another embodiment, an apparatus generally comprises an interface for receiving data on at least two wire pairs carrying pulse power, wherein the pulse power comprises a plurality of voltage pulses, and a controller for identifying transitions between at least one of a pulse-on time and a pulse-off time, and a pulse-off time and a pulse-on time on at least one of the wire pairs and controlling the data on the wire pair during the identified transitions on the wire pair to prevent interference between the pulse power and the data.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Conventional Power over Ethernet (PoE) or Power over Data Line (PoDL) systems used to simultaneously transmit power and data communications over the same twisted pair cable are typically limited in range and power capacity. The maximum power delivery capacity of standard PoE is approximately 100 W (watts) and standard PoDL is approximately 50 W, but many classes of powered devices would benefit from power delivery over 100 W and in some cases up to 1000 W to 2000 W. In conventional systems, when larger power delivery ratings are needed, power is supplied to a remote device through a local power source. It is therefore desirable to increase the power available over cables using one or more balanced transmission pairs to hundreds and even thousands of watts. This capability may enable many new choices in network deployments where major devices such as workgroup routers, multi-socket servers, large displays, wireless access points, fog nodes, IoT devices, or other devices operated over cables using one or more wire pairs. This capability would greatly decrease installation complexity and improve the total cost of ownership of a much wider set of devices that have their power and data connectivity needs met from a central device.

In order to increase available power, power may be transmitted in high voltage pulses (referred to herein as pulse power). The term "pulse power" as used herein refers to power that is delivered in a plurality of voltage pulses (sequence of voltage pulses) in which voltage varies between a very small voltage (e.g., close to 0V (volts), 3V) during a pulse-off time and a larger voltage (e.g., ≥12V) during a pulse-on time. The sequence of voltage pulses is generated during alternating on-time and off-time durations, with the sequence of voltage pulses comprising a high-state within the on-time duration (pulse-on) and a low-state within the off-time duration (pulse-off). High voltage pulse power (high voltage pulses) (e.g., >56V, ≥60V, ≥300V) may be transmitted from power sourcing equipment (PSE) to a powered device (PD) for use in powering the powered device, whereas low voltage pulse power (low voltage pulses) (e.g., ~12V, ~24V, ≤30V, ≤56V) may be used over a short interval for start-up (e.g., initialization, synchronization, charging local energy storage, powering up a controller, testing, or any combination thereof), as described, in U.S. patent application Ser. No. 16/671,508, ("Initialization and Synchronization for Pulse Power in a Network System"), filed Nov. 1, 2019, which is incorporated herein by reference in its entirety. Pulse power transmissions may be through cables, transmission lines, busbars, backplanes, PCBs (Printed Circuit Boards), and power distribution systems, for example.

In one or more embodiments, the pulse power may operate in a multiple phase (multi-phase) pulse power system to achieve less loss, effectively 100% duty cycle power delivery (e.g., continuous uninterrupted power to the output with overlapping phase pulses) to a powered device, while enhancing reliability per power connection and providing safe operation over an extended length of cable to deliver high power. As described in detail below, multiple phases (multi-phases) of voltage pulses may be delivered over a multi-pair cable with each of the phases associated with one or more data signals. Multiple pair cabling may be used, for example, with a DC pulse on each pair, timed in such a manner as to provide 100% net duty cycle continuous power at the powered device (or load), as described in U.S. patent application Ser. No. 16/380,954 ("Multiple Phase Pulse Power in a Network Communications System"), filed on Apr. 10, 2019, which is incorporated herein by reference in its entirety.

In one or more embodiments, the multi-phase pulse power may comprise Extended Safe Power (ESP). The term Extended Safe Power (ESP) as used herein may refer to high power (e.g., ≥100 W), high voltage (e.g., >56V) operation with pulse power delivered on multiple wire pairs (e.g., multi-phase pulse power with pulses offset from one another between wire pairs to provide continuous power), with fault detection (e.g., fault detection at initialization and between high voltage pulses), and synchronization between power sourcing equipment (PSE) and a powered device (PD).

As described below, pulse power may be delivered along with data over a wire pair (e.g., single balanced copper wire pair). The wire pair may be located within a Single Pair Ethernet (SPE) cable or a multiple pair (multi-pair) cable (e.g., two-pair cable, four-pair cable, or any other number of pairs). A problem that may occur with transmission of data with pulse power on a wire pair is that transition edges (transition from pulse-on time to pulse-off time or from pulse-off time to pulse-on time) of high voltage pulses may corrupt Ethernet packets. Thus, a simple summing of the pulse power and data signal together may result in data corruption on the pulse power transition edges and the data frequency spectrum may be washed out during pulse power transitions.

The embodiments described herein provide for mitigation of corruption of data due to pulse edges during pulse power transition time with transmission of data and pulse power on a wire pair. As described in detail below, the embodiments allow for data transmission on wire pairs carrying pulse power while avoiding potential interference that may be caused by the pulse power that is coupled onto the same pair of wires transmitting the data. Data transmission on the wire pair may be controlled during pulse power transitions to prevent interference between the pulse power and the data (mitigate possible corruption of the data). In one or more embodiments, a control circuit associated with the pulse power circuitry may hold (suspend, delay) the data during pulse power transitions at a transmitter. Data may also be modified (e.g., marked for possible error, dropped) at the receiver during the pulse power transitions. In one or more embodiments, FEC (Forward Error Correction) may be added to the control circuit to minimize the window in which data is held and maximize overall data rate. In one or more embodiments, modulation of the high voltage pulses may also be used in parallel with the data transmission for control plane data.

It is to be understood that the term "wire pair" as used herein may refer to a single wire pair (single twisted pair, single balanced copper wire pair, single wire pair Ethernet) located in a single pair cable (e.g., SPE, Base-T1 Ethernet) or a wire pair located in a multi-pair cable (e.g., two-pair cable, four-pair cable, Base-T Ethernet). The other wire pairs in the multi-pair cable may deliver data, power, data and power (PoE, PoDL), or data and pulse power (e.g., ESP) as described herein. The multi-pair cable may comprise multiple instances of single wire pairs (e.g., SPE, PoDL configuration) in parallel, or multiple wire pairs connected between a pair center tap (e.g., PoE configuration), and the wire pairs may operate together in a multi-phase pulse power system (e.g., ESP). A system for transmitting pulse power and data over a multi-pair cable comprising more than one wire pair configured to transmit data and pulse power may comprise more than one circuit or additional components described below with respect to FIGS. 4-10 to prevent data corruption during power transitions for each wire pair. As described in detail below, various logic and circuits may be used to provide pulse power and data on a single wire pair while avoiding Ethernet corruption during the pulse power transition times due to the pulse power transition edges. The circuits may be used to avoid potential interference caused by the pulse power that is coupled on the same pair of wires as the data.

Referring now to the drawings and first to FIG. 1, an example of a network in which the embodiments described herein may be implemented is shown. For simplification, only a small number of nodes are shown. PSE (Power Sourcing Equipment) 10 transmits pulse power to a plurality of PDs 12 on cable 14 (e.g., SPE, multi-pair cable comprising one or more wire pairs transmitting data and pulse power). The embodiments operate in the context of a data communications network including multiple network devices. The network may include any number or arrangement of network devices in communication via any number of nodes (e.g., routers, switches, gateways, controllers, access points, or other network devices) operable to route (switch, forward) data communications and facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT) network, Internet, intranet, or any other network).

Signals may be exchanged among communications equipment and power transmitted from the PSE 10 to the PDs 12 on a wire pair within the cable 14. Data may be transmitted from the PSE 10 to the PD 12, from the PD to the PSE, or in both directions (bidirectional communications from the PSE to the PD and from the PD to the PSE). The network is configured to pass electrical power along with data to provide both data connectivity and electrical power to network devices 12, which may include switches, routers, access points, IoT devices, or other electronic components and devices. The power may be transmitted from the PSE 10 to end points (PDs) 12, which may be located at distances up to 1000 m, for example, and at power levels greater than 50 W (e.g., 100 W, 250 W, 500 W, 1000 W, 2000 W, or any other power level).

The PSE 10 is operable to receive external power (not shown) and transmit power (e.g., pulse power, high voltage pulse power, multi-phase pulse power) over SPE or multi-pair cables 14 in the communications network. The PSE (power and data source) 10 may comprise a power supply unit (PSU) for receiving and distributing power (described below with respect to FIG. 12) and a network interface for receiving data (e.g., one or more fabric cards or line cards). The PSE 10 is operable to provide high capacity power from an internal power system (e.g., one or more PSUs capable of delivering power over and including 100 W (e.g., 1 kW or higher)) and driving the plurality of devices 12 each in the 50 W-2000 W range, or any other suitable power range. The PSE 10 may comprise, for example, a router, switch, convergence system, or any other suitable line card system or network device operable to transmit power and data.

One or more of the network devices 12 may also deliver power to equipment using PoE, PoDL, or ESP. For example, one or more of the powered devices 12 may deliver power to electronic components such as IP (Internet Protocol) cameras, VoIP (Voice over IP) phones, video cameras, point-of-sale devices, security access control devices, residential devices, building automation devices, industrial automation devices, factory equipment, lights (building lights, streetlights), traffic signals, fog nodes, IoT devices, sensors, or other electrical components and devices. One or more of the PDs 12 may also operate as a PSE and deliver ESP to one or more downstream devices. In one or more embodiments, a redundant PSE (not shown) may provide backup or additional power or bandwidth, as needed in the network. In one or more embodiments, there is no need for additional electrical wiring for the communications network and all of the network communications devices 12 operate using the power provided by the PSE 10 (or multiple PSEs).

The cable 14 comprises at least two conductors (copper wires). The cables 14 extend from the PSE 10 to the PDs 12 and may be formed from any material suitable to carry both electrical power and data. The cables 14 may be connected to the network devices 10, 12 with a connector (connection, coupling, connector assembly) formed from a plug (also referred to as a male connector) and a receptacle (also referred to as a port, jack, receiver, or female connector) coupled together. The connection may be used for connecting communications equipment through cables 14 configured to carry both data and power. The connector may comprise, for example, a modified RJ-45 type connector or any other suitable connector. If the cable is an SPE cable, an SPE connector may be configured with a small form factor that allows for an increased number of ports as compared to conventional four-pair connectors.

The cable 14 may be configured according to a standard cable gauge and rated for one or more power or current levels, a maximum power level, a maximum temperature, or identified according to one or more categories indicating acceptable power level usage, for example. In one example, the cable 14 may correspond to a standardized wire gauge system such as AWG (American Wire Gauge). The cable 14 may comprise, for example, 18 AWG or other suitable size cable. For different gauge wire, AWG provides data including diameter, area, resistance per length, ampacity (maximum amount of current a conductor can carry before sustaining immediate or progressive deterioration), and fusing current (how much current it takes to melt a wire in free air). Various other standards (e.g., NEC (National Electrical Code), UL (Underwriters Laboratories)) may be used to provide various requirements for the cables and connectors and provide temperature or power ratings or limits, or other information. In one or more embodiments, the cable 14 may also include optical fibers (as described below with respect to FIGS. 16 and 17), cooling, or any combination of electrical wires (power and data), optical fibers (data), and coolant tubes (cooling).

The network may also include appropriate safety features as needed for higher power operation (e.g., insulation, process for power/cable compatibility confirmation, control circuit check for open/short, or thermal sensor). Touch-safe fault protection may be provided through cable and connector designs that are touch-safe even with high voltage applied. In one or more embodiments, the connector and cable 14 are configured to meet standard safety requirements for line-to-ground protection and line-to-line protection at relevant high voltage by means including clearance and creepage distances, and touch-safe techniques. The connector may comprise safety features, including, for example, short-pin for hot-plug and hot-unplug without current surge or interruption for connector arcing protection. The connector may further include additional insulation material for hot-plug and hot-unplug with current surge or interruption with arc-flash protection and reliability life with arcing. The insulated cable power connector terminals are preferably configured to meet touch voltage or current accessibility requirements.

In one or more embodiments, the network may incorporate safety features as described in U.S. patent application Ser. No. 16/671,508, referenced above. For example, the system may test for thermal buildup, a current disparity, a ground fault, or any combination thereof. In one or more embodiments, fault sensing may be performed through a low voltage safety check combined with a digital interlock that uses the data system to provide feedback on the power system status and set a power operating mode. The fault sensing may be performed, for example, during a low voltage start-up or between high voltage pulses (e.g., low voltage fault detection between high voltage pulses). Fault sensing may include, for example, line-to-line fault detection with low voltage sensing of the cable or powered device and line-to-ground fault detection with midpoint grounding.

The power safety features provide for safe system operation and installation and removal (disconnect) of components.

In one or more embodiments, a signature of the voltage pulse may be analyzed for each cycle. This analysis may be a rising edge, falling edge, or both. If the signature is corrupt by an unexpected load, the high voltage pulses may be stopped until it is determined that the load is safe to power. The signature may be corrupted, for example, by a human, short, or open.

If a fault is identified on one of the wire pairs, transmission of power may be interrupted on the wire pair, while power continues to be transmitted on the remaining wire pairs. It is to be understood that the safety features described above are only examples of safety or fault protection features that may be included for delivery of high voltage pulse power. Any combination of these or other safety features may be used with the embodiments described herein.

In one or more embodiments, the system may employ a dual-power mode that detects and negotiates between the power source 10 and the powered device 12. This negotiation (e.g., auto-negotiation) may, for example, distinguish between and accommodate different power-delivery schemes, such as PoDL, PoE, ESP or other power modes, or power levels. For example, standard PoDL distribution may be used for remote network devices rated less than about 50 W, standard PoE distribution may be used for remote network devices rated less than about 90 W, and for higher power remote powered devices, pulse power or multi-phase pulse power (e.g., ESP) may be used to create an efficient energy distribution network.

As described in detail below, a data signal (encoded data, modulated data signal) is transmitted with the pulse power (data signal superimposed on pulse power, pulse power coupled onto the wires transmitting data). The data signal may comprise data including power telemetry, control data, fault notification (e.g., transmission error, phase fault (in multi-phase system), over current, arc event, time base control synchronization fault, MAC drop, or any other communication or power fault or error), auto-negotiation between PSE and PD (e.g., modulator switch timing, power level), synchronization information for modulator switches (e.g., pulse width data, data communications to control pulse-off/pulse-on synchronization), enterprise data, or other data communications to create a bidirectional communications link between the PSE and PD. In one or more embodiments, the data signal may be used to provide pulse synchronization between the PSE and PD during initialization or normal operation, as described in U.S. patent application Ser. No. 16/671,508, referenced above.

In one or more embodiments, 100 Mbps to 1000 Mbps data may be delivered over a distance of approximately 40 meters, 10 Gbps data may be delivered over a distance of approximately 15 meters, or 10 Mbps data may be delivered over a distance of approximately 1 km. In one example, data may be transmitted at a rate of 1 Gbps at a distance up to 40 m in accordance with IEEE 802.3bp or IEEE 802.3bw, data may be transmitted at 10 Mbps for a distance up to 1000 m in accordance with IEEE 8002.3cg, or data may be transmitted at 2.5 Gbps-10 Gbps over a distance up to 10 m or 15 m in accordance with IEEE 802.3ch. It is to be understood that the power levels, data transmission rates, and distances described herein are provided only as examples and other power levels or transmission rates in combination with other distances may be used in accordance with the above referenced standards or any other applicable standard or future standard, without departing from the scope of the embodiments.

Furthermore, it is to be understood that the network devices and topology shown in FIG. 1 and described above is only an example and the embodiments described herein may be implemented in networks comprising different network topologies or network devices, without departing from the scope of the embodiments. For example, the network may comprise any number or type of network communications devices that facilitate passage of data over the network (e.g., routers, switches, gateways, controllers, access points), network elements that operate as endpoints or hosts (e.g., servers, virtual machines, clients, IoT devices), and any number of network sites or domains in communication with any number of networks. Thus, network nodes may be used in any suitable network topology, which may include any number of servers, virtual machines, switches, routers, or other nodes interconnected to form a large and complex network, which may include cloud or fog computing. Nodes may be coupled to other nodes or networks through one or more interfaces employing any suitable connection, which provides a viable pathway for electronic communications along with power.

Figure 2:
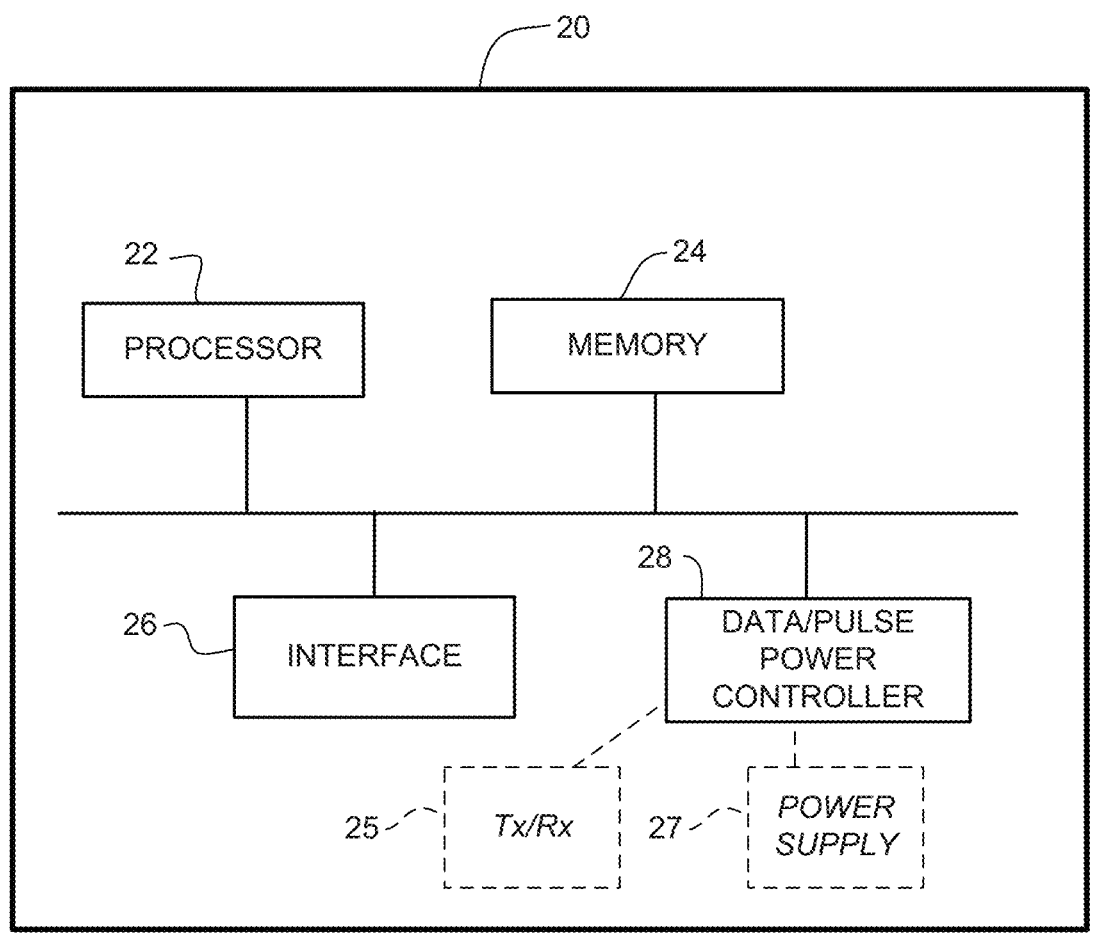
FIG. 2 depicts an example of a network device useful in implementing embodiments described herein.

FIG. 2 illustrates an example of a network device 20 (e.g., PSE 10, PD 12 in FIG. 1) that may be used to implement the embodiments described herein. In one embodiment, the network device 20 is a programmable machine that may be implemented in hardware, software, or any combination thereof. The network device 20 includes one or more processor 22, memory 24, interface 26, and data/pulse power controller 28. The data/pulse power controller is in communication with one or more data components 25 (e.g., transceiver (Tx/Rx)) and power components 27 (e.g., power supply, pulse power generator at PSE, modulator switches at PSE or PD, pulse power circuitry) and may control data transmissions and pulse power modulation through control of modulator switches, as described below.

Memory 24 may be a volatile memory or non-volatile storage, which stores various applications, operating systems, modules, and data for execution and use by the processor 22. For example, components of the controller 28 (e.g., code, logic, software, or firmware, etc.) may be stored in the memory 24. The network device 20 may include any number of memory components.

The network device 20 may include any number of processors 22 (e.g., single or multi-processor computing device or system), which may communicate with a forwarding engine or packet forwarder operable to process a packet or packet header. The processor 22 may receive instructions from a software application or module, which causes the processor to perform functions of one or more embodiments described herein. The processor 22 may also operate one or more components of the controller 28.

As described in detail below, the controller 28 is configured to identify transitions in the voltage pulses (e.g., transition from pulse-on (high-state) to pulse-off (low-state), transition from pulse-off to pulse-on, or both transitions) on a wire pair and control data transmission or received data on the wire pair (e.g., suspend transmission of data (data signal) at a transmitter or modify processing of data (e.g., discard, mark, provide feedback) at a receiver for a duration of time with respect to the transition edge. The controller 28 may also modulate pulses of the pulse power to create a data signal for transmitting control plane data from the PSE to the PD, as described below. It is to be understood that the controller 28 may comprise one or more control devices (elements, units, circuits). For example, the data/pulse power controller 28 may comprise components (e.g., modules, gate, buffer, FEC block, packet marking/dropping block, encoder, decoder, error correcting code, software, or logic, as described below with respect to FIGS. 4-10) located at the PSE 10, the PD 12, or both the PSE and PD and interconnected through the power and data wire pair (combined power and data cable 14) (FIGS. 1 and 2).

Logic may be encoded in one or more tangible media for execution by the processor 22. For example, the processor 22 may execute codes stored in a computer-readable medium such as memory 24. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described below with respect to the flowcharts of FIGS. 11A, 11B, 11C, 11D, 15A and 15B). The network device 20 may include any number of processors 22.

The interface 26 may comprise any number of network interfaces (line cards, ports, inline connectors (e.g., receptacle)) for transmitting or receiving power and transmitting and receiving data. The network interface 26 may be configured to transmit or receive data using a variety of different communications protocols and may include mechanical, electrical, and signaling circuitry for communicating data over physical links coupled to the network interfaces. For example, line cards may include port processors and port processor controllers. One or more of the interfaces may be configured for PoDL on SPE, PoE or ESP on multi-pair cable, or any combination thereof.

It is to be understood that the network device 20 shown in FIG. 2 and described above is only an example and that different configurations of network devices may be used. For example, the network device 20 may further include any suitable combination of hardware, software, algorithms, processors, devices, components, or elements operable to facilitate the capabilities described herein.

Figure 3B:
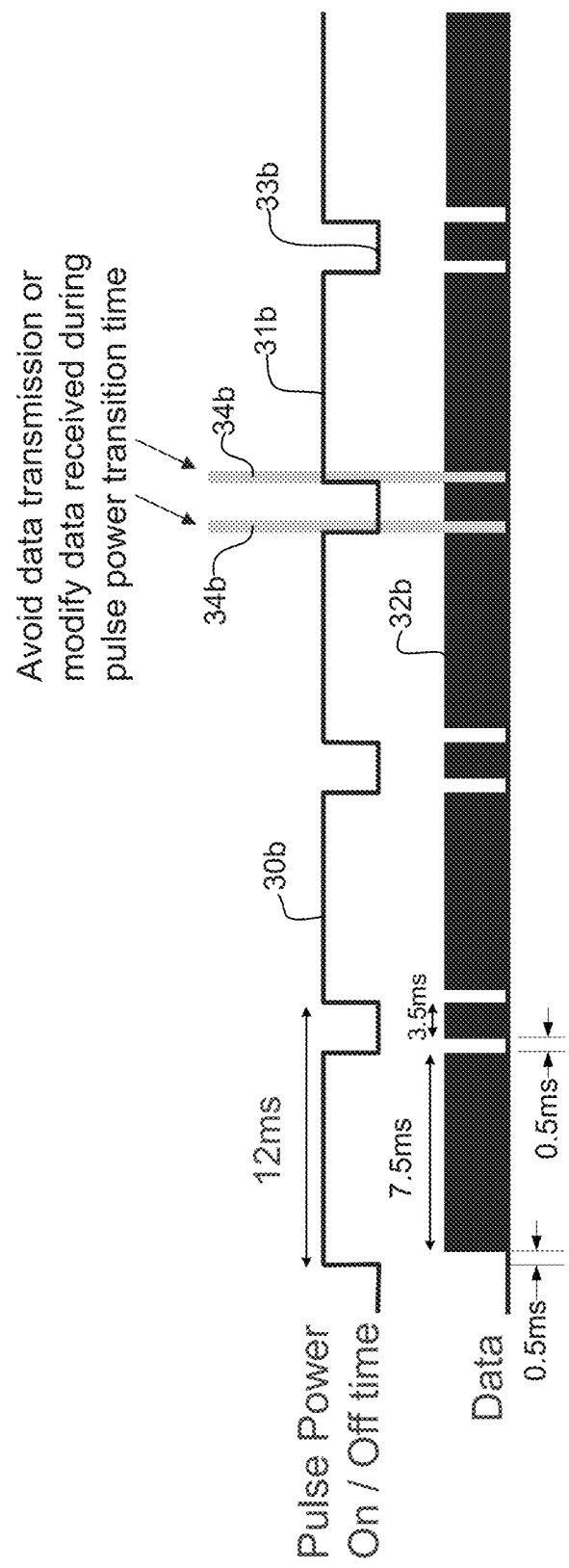
FIG. 3B illustrates another example of pulse power and data transmission over a single wire pair with avoidance of data transmission during pulse power transition times.

FIGS. 3A and 3B illustrate examples of pulse power on/off cycles with data transmittal (e.g., 10 Mbps data (or any other data rate)) on a wire pair. The timing diagrams are schematically shown and not to scale.

In the example shown in FIG. 3A, a pulse power cycle comprises a pulse-on time 31a (high-state, high power) of 4 ms and a pulse-off time 33a (low-state, low power) of 1 ms. As previously described, edges of pulse power signal 30a during pulse power transitions 34a (time period (duration) covering a transition from pulse-on to pulse-off or from pulse-off to pulse-on) may impact data signal 32a. As described below, the data is controlled during the pulse power transitions 34a to prevent interference between the pulse power and the data. In one or more embodiments, the data (data signal 32a, data transmission) is controlled (e.g., suspended, modified) for a duration of time (e.g., 0.5 ms as shown in FIG. 3A, or until the transition is complete as indicated by pulse power circuitry) with respect to the transition edge (start of transition identified by the controller (e.g., controller receiving input from pulse power circuitry)). For example, the data transmission may be suspended at the transmitter or data may be modified (e.g., dropped, marked, FEC decode applied, erasure-correcting decode applied, buffered) at the receiver during the pulse power transitions 34a.

In the example shown in FIG. 3A, the pulse power transition 34a covers a 0.5 ms time period. It is to be understood that this is only an example, and the pulse power transition may extend over different time periods. As shown in the example of FIG. 3A, data is transmitted for 3.5 ms during the pulse-on time 31a (following a delay during a first transition), suspended for 0.5 ms during the transition from pulse-on to pulse-off, transmitted for 0.5 ms during the pulse-off time 33a, and suspended for 0.5 ms during the transition from pulse-off to pulse-on. This cycle is repeated to avoid data transmission or modify data received during the pulse power transition times 34a. Holding off (suspending) data transmission during this transition period 34a provides a clear distinction between the pulse power and data, thereby providing the pulse circuitry a reliable method to determine faults, while eliminating application of significant coding and signaling to the data stream.

In the example shown in FIG. 3B, a pulse power cycle comprises an 8 ms pulse-on time 31b and 4 ms pulse-off time 33b. The longer pulse off time may be used for fault sensing, for example. As described above, edges of pulse power signal 30b during pulse power transitions 34b (time period covering a transition from pulse-on (on-time) to pulse-off (off-time) or from pulse-off to pulse-on) may impact data signal 32b, thus the data transfer may be controlled (e.g., suspended or modified) during the pulse power transitions 34b. In the example of FIG. 3B, data is delayed for 0.5 ms as the pulse power transitions from pulse-off to pulse-on, and then transmitted for 7.5 ms during pulse-on time 31b, suspended (stopped, held, delayed) for 0.5 ms while the pulse power transitions from pulse-on to pulse-off, and resumed for 3.5 ms during pulse-off 33b. This 12 ms cycle is repeated, avoiding data transmission or modifying received data during the pulse power transition times 34b to prevent corruption of data (interference between the pulse power and data).

It is to be understood that the power duty cycles shown in FIGS. 3A and 3B are only examples and that different pulse-on times, pulse-off times, or transitions times may be used, without departing from the scope of the embodiments. In one example, a period of one cycle (i.e., one pulse-on and one pulse-off) is less than or equal to 12 ms. In another example, the period is less than or equal to 5 ms. It should be noted that pulse power transitions (from pulse-on to pulse-off or from pulse-off to pulse-on) may occur over a period of time (e.g., rising or falling slope or curve) and the transition time period 34a, 34b in which data transmissions are avoided may be different than shown. As described below with respect to FIGS. 14A and 14B, the start and end of the pulse-on time may be different for the PSE and the PD and the transition time may include tolerance to cover transition edges at the PSE, the PD, or both the PSE and PD.

It may be noted that data transmissions may be controlled during transition time from pulse-off to pulse-on, from pulse-on to pulse-off, or both transitions as shown in the examples of FIGS. 3A and 3B. Also, in the examples shown in FIGS. 3A and 3B data is transmitted during pulse-on time 31a, 31b and pulse-off time 33a, 33b. In one or more embodiments, data may be transmitted only during pulse-on time (e.g., if the pulse-off time 33a, 33b is small (e.g., close to 0.5 ms)).

As previously discussed, the pulse power is coupled onto the same pair of wires transmitting the data and the data may potentially be corrupted during the pulse transitions. As shown in FIGS. 3A and 3B, there is no significant change in the pulse power with or without data transmission and there is no need to modify the voltage level or pulse power duty cycle to accommodate the data transmissions. As previously described, the data signal may be transmitted during the pulse-on time and the pulse-off time, with no modifications needed to the pulse power to accommodate the data signal.

Figure 7:
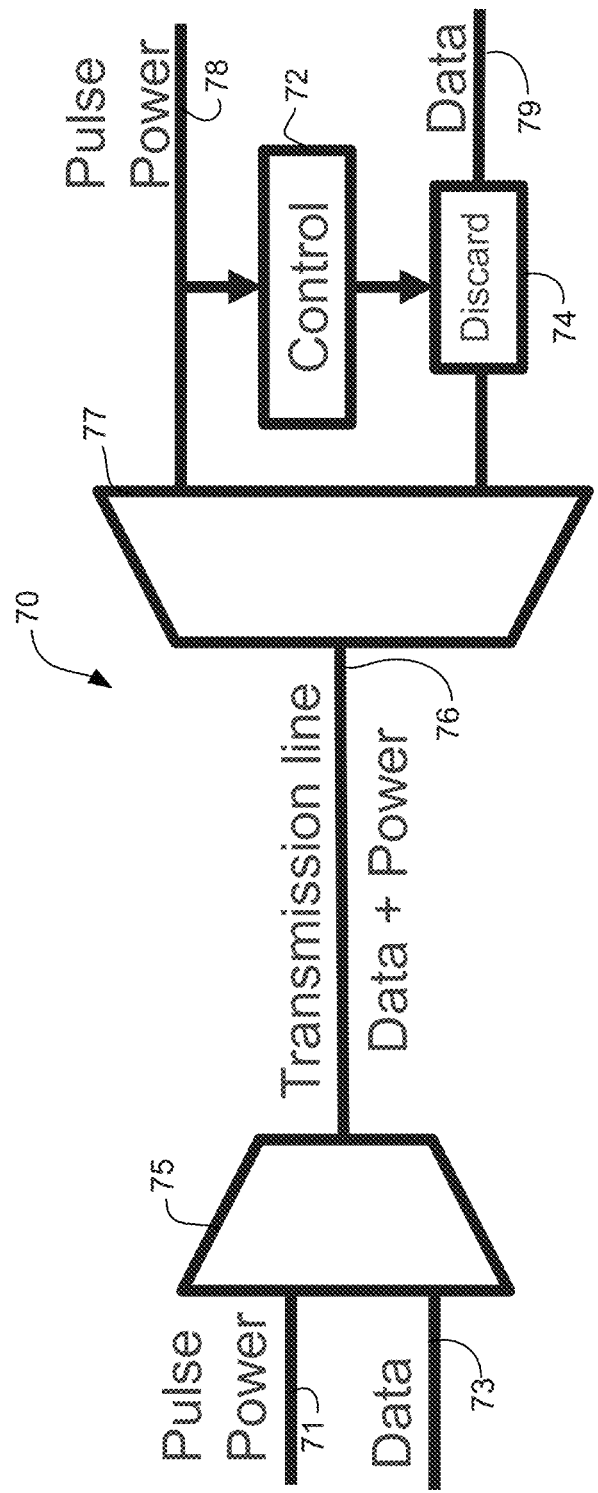
FIG. 7 is a schematic of a system for delivering pulse power and data on the single wire pair with use of pulse power transitions to mark packets for discard at the receiver, in accordance with one embodiment.
Figure 8:
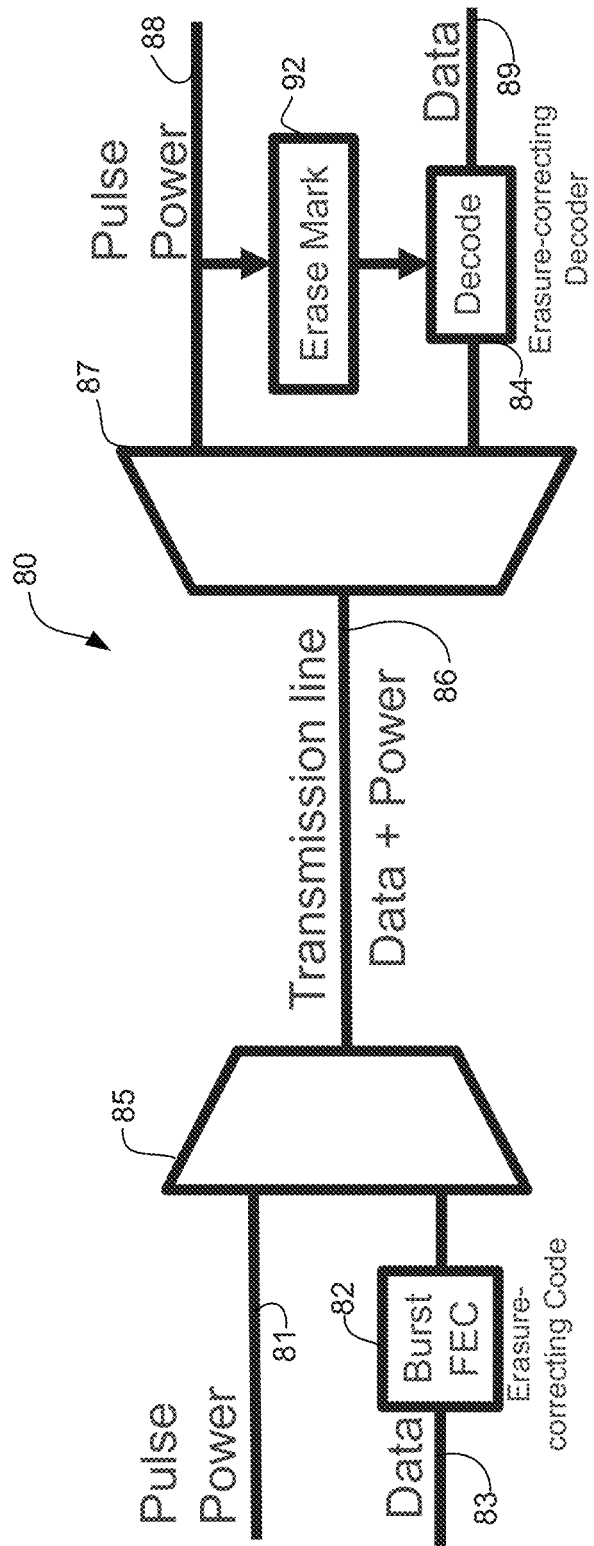
FIG. 8 is a schematic of a system for delivering pulse power and data on the single wire pair with use of pulse power transitions to mark data for possible error at the receiver for use with FEC (Forward Error Correction), in accordance with one embodiment.
Figure 9:
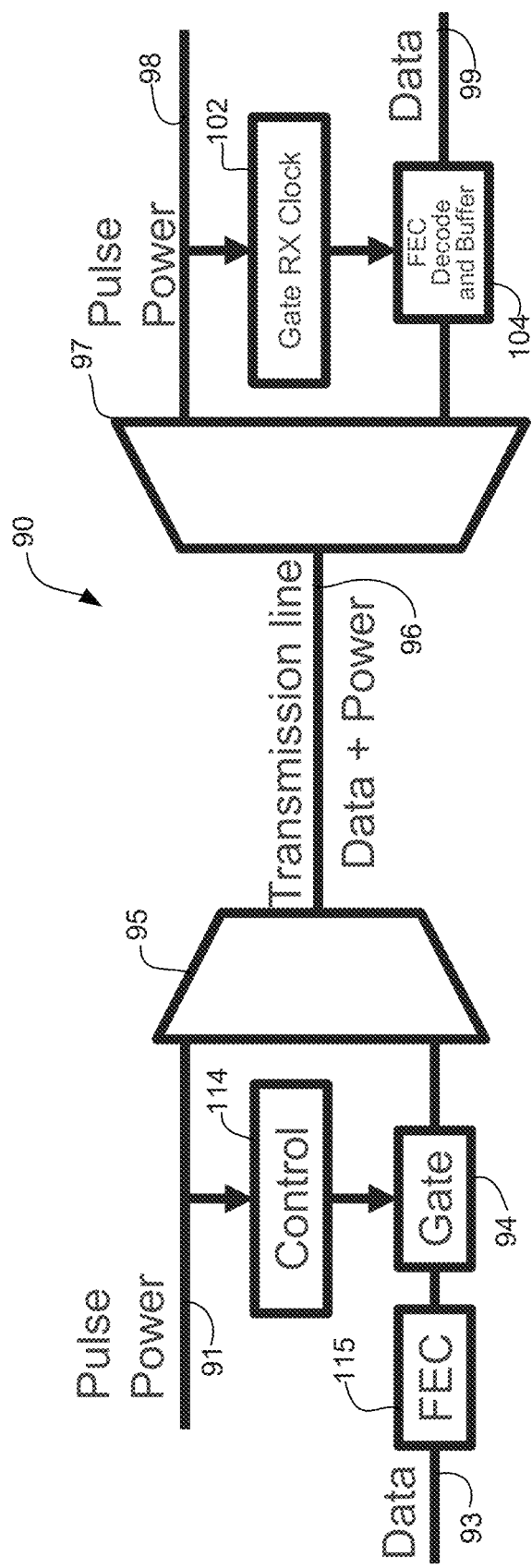
FIG. 9 is a schematic of a system for delivering pulse power and data on the single wire pair with use of pulse power transitions to control data transmission at the transmitter and a buffer and FEC decoder at the receiver, in accordance with one embodiment.
Figure 10:
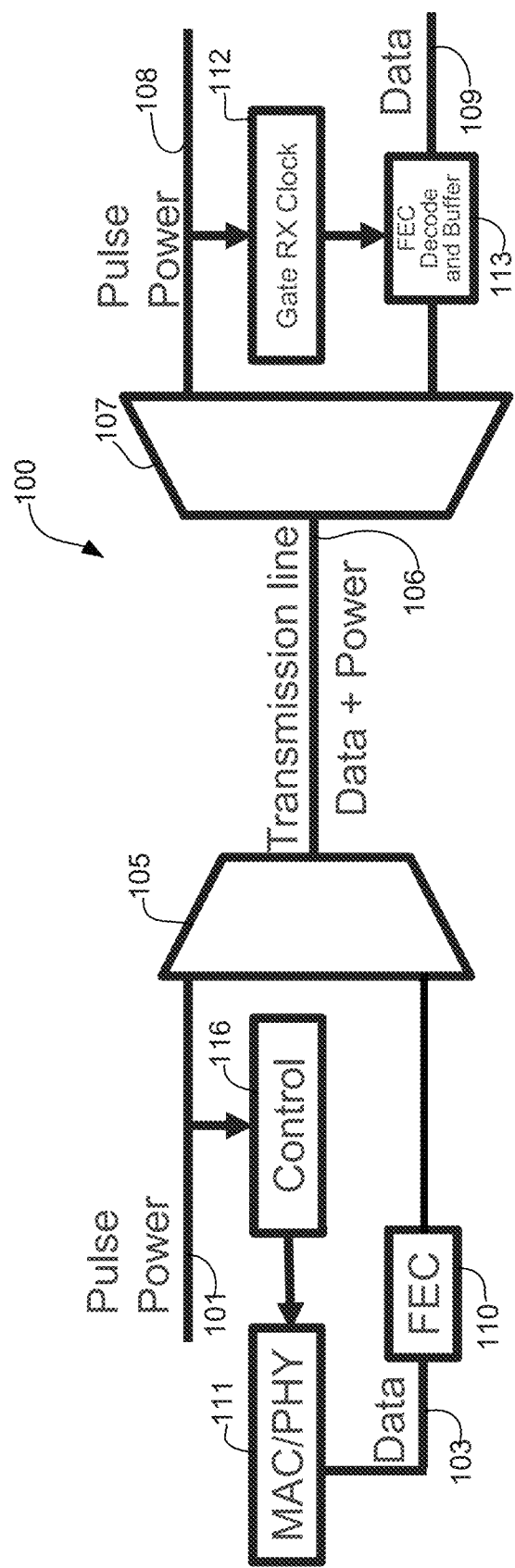
FIG. 10 is a schematic of a system for delivering pulse power and data on the single wire pair with use of pulse power transitions to control the MAC/PHY to hold off data transmission at the transmitter and a buffer and FEC decoder at the receiver, in accordance with one embodiment.

As described below with respect to FIGS. 4-10, data transmissions may be suspended (held, delayed) at the transmitter during pulse power transition times (FIGS. 4 and 5), may be modified (dropped, marked) at the receiver during pulse power transition times (FIGS. 6 and 7), or locations of the pulse power transitions at the receiver may be used to indicate the location of possible errors in the data, with corrections at the transmitter (FIGS. 8, 9, and 10). As previously described, data may be transmitted by the PSE and received at the PD or transmitted by the PD and received by the PSE (FIG. 1). Thus, in the examples described below and shown in FIGS. 4-10, the transmitter may be at the PSE and the receiver at the PD, or the transmitter may be at the PD and the receiver at the PSE.

Figure 4:
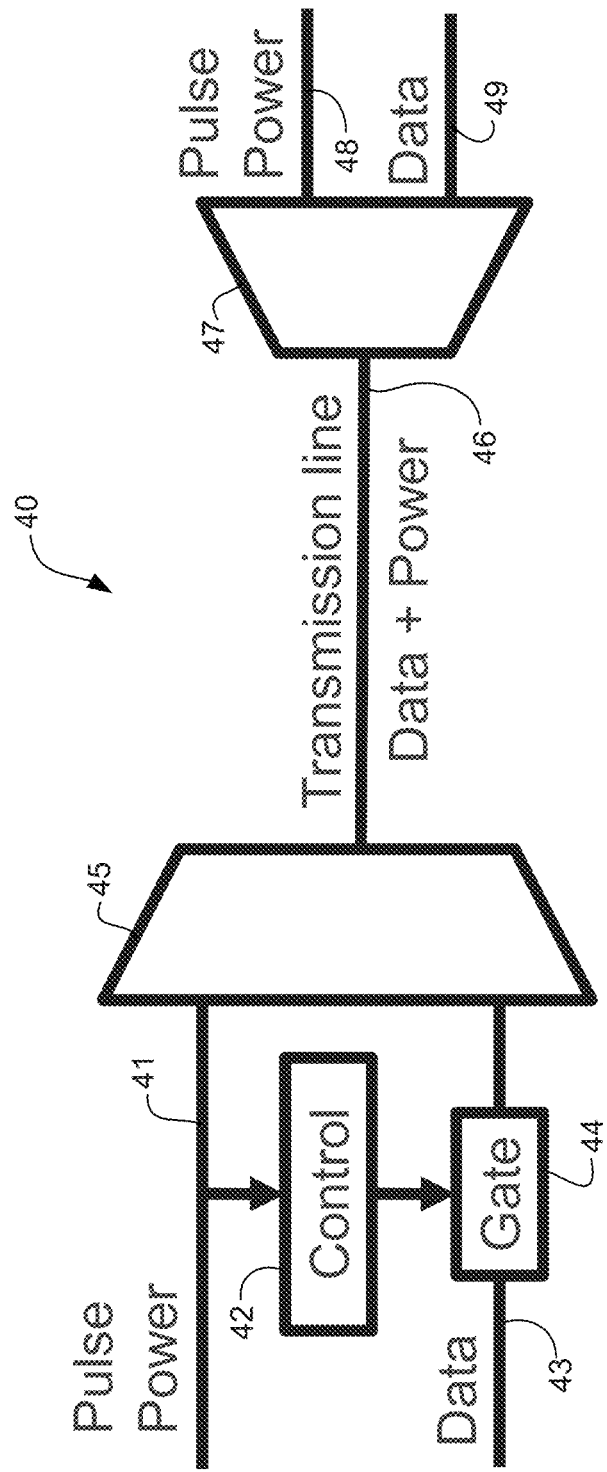
FIG. 4 is a schematic of a system for delivering pulse power and data on the single wire pair with use of pulse power transitions to control data transmission at a transmitter, in accordance with one embodiment.
Figure 5:
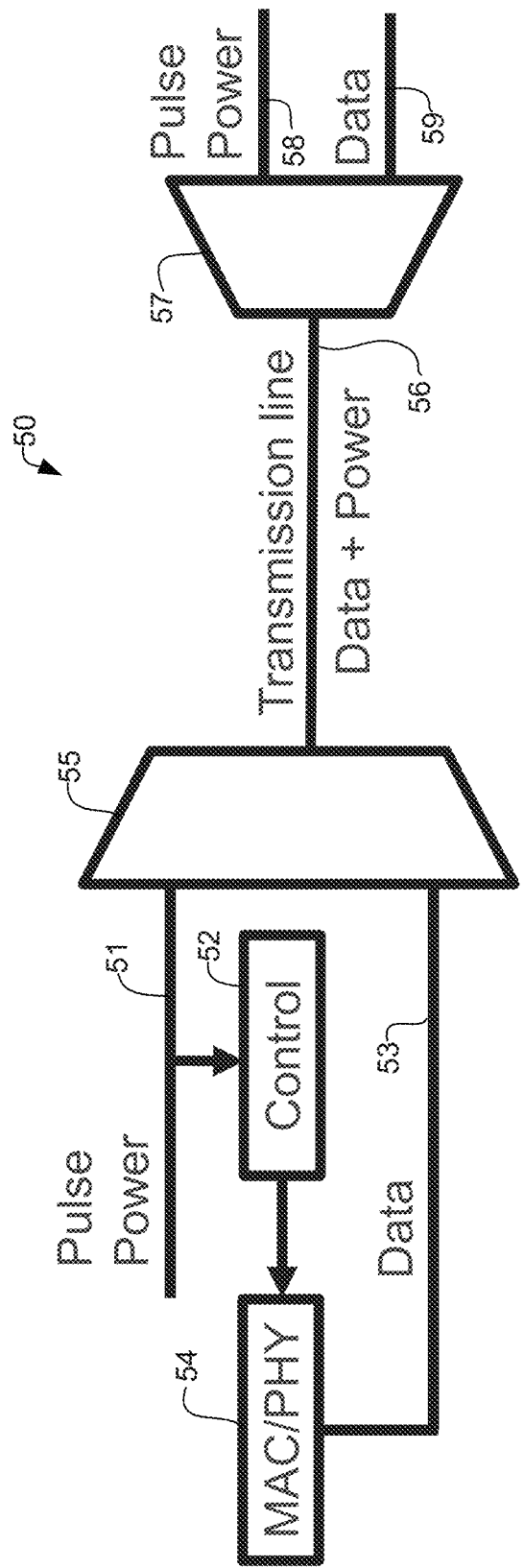
FIG. 5 is a schematic of a system for delivering pulse power and data on the single wire pair with use of pulse power transitions to control a MAC/PHY to hold off data transmission at the transmitter, in accordance with one embodiment.

Referring first to FIGS. 4 and 5, examples of circuits that may be used to avoid data transmission at the transmitter during the pulse power transitions are shown. FIG. 4 illustrates an example of a system, generally indicated at 40, that may be used to hold off data transmissions during periods of potential corruption (e.g., pulse power transition time periods 34a, 34b shown in FIGS. 3A and 3B), in accordance with one embodiment. Pulse power and data are coupled at lines 41, 43 to transmitter (multiplexer) 45 and data is transmitted over a single wire pair 46 (e.g., SPE cable, multi-pair cable) coupled to receiver (demultiplexer) 47 connected to pulse power line 48 and data line 49. In one example, the pulse power and data input lines 41, 43 and transmitter 45 may be located at the PSE 10 in FIG. 1, and the receiver 47 and pulse power and data output lines 48, 49 may be located at the PD 12. Transmission line 46 represents the cable 14 in FIG. 1 (e.g., SPE cable, multi-pair cable). The block 45 is referred to as a multiplexer/transmitter at a transmitting end (e.g., PSE 10 in FIG. 1) and the block 47 is referred to as a demultiplexer/receiver at a receiving end (e.g., PD 12 in FIG. 1). It is to be understood that data on line 49 may also be transmitted from the PD 12 to the PSE 10 on the cable 14 (FIGS. 1 and 4), as previously noted.

In the example shown in FIG. 4, pulse power edges are used to control a buffer for the data through control block 42 providing input to gate 44. Since the PSE generates the data and the pulse power in this example, the data transmitter has direct access to the power signal timing at the PSE. If the data is transmitted from the PD, the data transmitter accesses local signal timing at the PD. The controller 42 holds off transmission of data at data input 43 during pulse power transition times. Referring to the power and data duty cycle shown in FIG. 3A, as the pulse power transitions to pulse-off, the controller 42 instructs the gate 44 to buffer (suspend, delay, hold) data for 0.5 ms (or any other time period covering the transition time period). Data is transmitted for 0.5 ms during the pulse-off time and is then suspended for another 0.5 ms while the pulse power transitions from pulse-off to pulse-on. As previously noted, the data timing cycles shown in FIGS. 3A and 3B are only examples and different timing may be used, without departing from the scope of the embodiments. For example, power may be cycled on or off for a different time period and the length of time for which the data is buffered during the pulse power transition time may be different than 0.5 ms.

FIG. 5 illustrates a system, generally indicated at 50, for controlling data transmission for use with pulse power, in accordance with one embodiment. Pulse power line 51 provides input to control block 52, which controls MAC (Media Access Control)/PHY (Physical layer entity) block 54 to hold off data transmission during pulse power transition edges. The PHY block 54 contains functions that transmit, receive, and manage encoded signals that are impressed on and recovered from the physical medium. Pulse power at line 51 and data at line 53 are input at block (multiplexer) 55 and transmitted over transmission line 56 to block (demultiplexer) 57 connected to pulse power line 58 and data line 59. In this example, components 51, 52, 53, 54, and 55 are located at the PSE 10 and components 57, 58, and 59 are located at the PD 12 in FIG. 1. As previously described, data may also be transmitted from the PD to the PSE. Referring again to the power and data duty cycle shown in FIG. 3A, as the pulse power transitions to pulse-off, the controller 52 instructs the MAC/PHY block 54 to buffer data for 0.5 ms. Data is then transmitted for 0.5 ms during pulse-off time and once again suspended for another 0.5 ms while the pulse power cycles to pulse-on. As previously noted, different power duty cycles may be used without departing from the scope of the embodiments.

Figure 6:
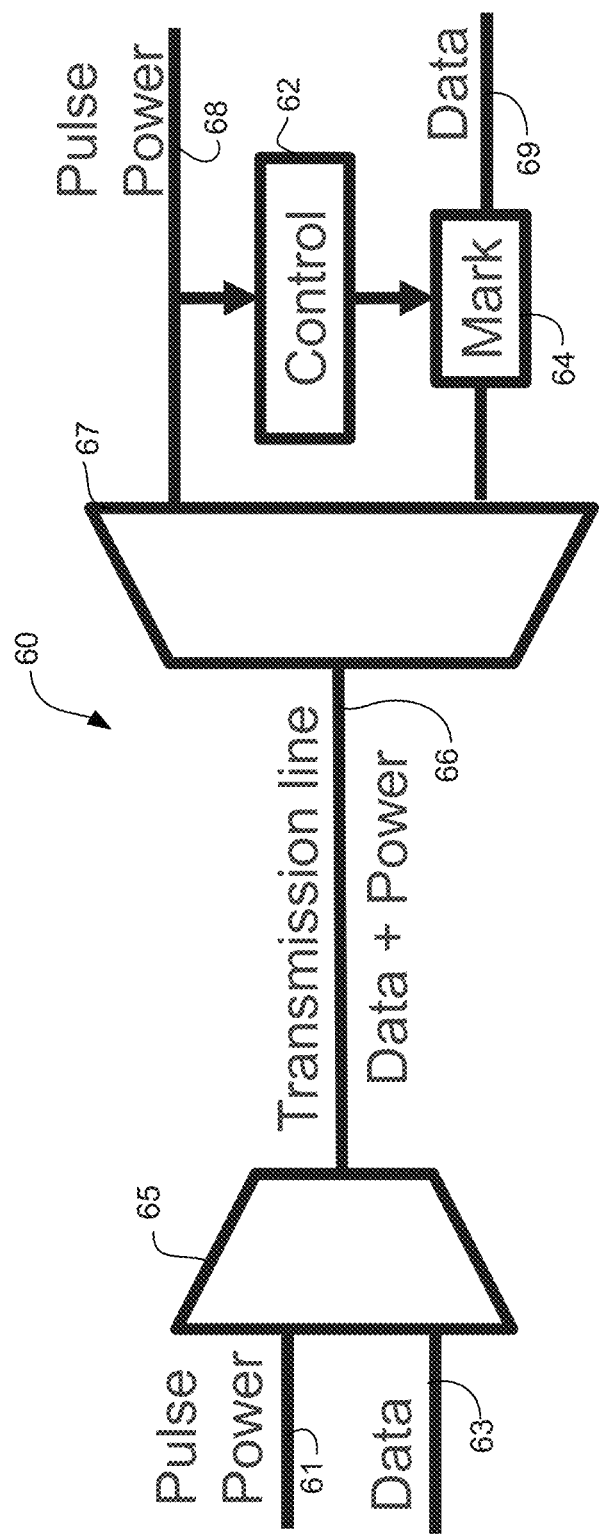
FIG. 6 is a schematic of a system for delivering pulse power and data on the single wire pair with use of pulse power transitions to mark packets for possible error at a receiver, in accordance with one embodiment.

FIGS. 6 and 7 show examples of systems 60, 70, respectively, in which pulse power transitions are used to control data at the receiving end. As described in detail below, pulse power transition edges may be used to mark packets, which may be dropped or retried (retransmission request). In the example described below, data is transmitted from the PSE to the PD, however, as previously noted, data may also be transmitted from the PD to the PSE.

FIG. 6 illustrates a system, generally indicated at 60, operable to use pulse power transition edges at pulse power line 68 at receiver (demultiplexer) 67 to mark data for errors at data line 69, in accordance with one embodiment. Pulse power is received at line 61 and data is received at line 63 at transmitter (multiplexer) 65 and transmitted over single wire pair 66 to the receiver 67 (e.g., PD 12). A controller 62 uses the pulse power transition edges to mark packets for possible error at block 64. Packets marked for error may be dropped, depending on the number of bit errors or requested to be retried based on packet type, for example.

FIG. 7 illustrates a system, generally indicated at 70, operable to use pulse power transition edges to mark data for discard at data line 79, in accordance with one embodiment. Pulse power is received at line 71 and data is received at line 73 at transmitter 75 (e.g., PSE 10 in FIG. 1) and transmitted over single wire pair 76 to the receiver 77 (e.g., PD 12 in FIG. 1). Controller 72 marks packets to drop at block 74 on the data line 79 at the receiver based on the pulse power transition times. In this example, all packets are dropped at discard block 74 during the pulse power transitions. Client recovery may be needed on each side of the line to prevent data quality issues.

FIGS. 8, 9, and 10 illustrate systems 80, 90, and 100, respectively, which use locations of the pulse power transitions to indicate the location of possible errors in the data. FEC (Forward Error Correction) may be used to correct errors in the data identified as being received during pulse power transitions (FIG. 8) or for use on data that is not held off during pulse power transitions when used in combination with suspending data during pulse power transitions at the PSE (FIGS. 9 and 10). The FEC may utilize any suitable error correcting code to control errors in the data transmission (e.g., Reed-Solomon or any other suitable code). The error correcting code provides redundancy, which allows the receiver to detect errors and correct errors without retransmission. In one or more embodiments, the data may be encoded with an erasure correcting code at the transmitter using burst FEC and encoded at the receiver, as described below with respect to FIG. 8.

FIG. 8 illustrates a system, generally indicated at 80, for use in marking the location of symbols likely to be in error for an erasure-correcting decoder 84 at the PD, in accordance with one embodiment. Pulse power is received at line 81 and data at line 83 at multiplexer 85. FEC (e.g., burst FEC erasure-correcting code) is applied at block 82. The data and power are transmitted on SPE transmission line 86 to receiver (demultiplexer) 87. As previously noted, data may also be transmitted from the PD to the PSE, in which case data would be transmitted and power received. Locations of the pulse power transitions on power line 88 are used to mark the location of symbols likely to be in error at block 92. The erasure-correcting decoder 84 decodes the marked data at data line 89. This may increase the number of errors that can be corrected by a factor of two, for example, and may significantly reduce the number of packet drops or retries.

FIG. 9 illustrates a system, generally indicated at 90, in which data transmission is gated based on pulse power transitions (as described above with respect to FIG. 4) and FEC is used to protect the remaining data. The pulse power at line 91 is used to indicate pulse power transitions at controller 114, which provides input at gate 94 to hold the data during the pulse power transitions. FEC block 115 at the transmitter is used along with decoder 104 at the receiver to protect the remaining data transmitted at 95 on single wire pair 96 and received at multiplexer 97. The order of the gate 94 and FEC block 115 may be interchanged at the transmitter. At the receiver, pulse power line 98 provides input at a gate receiver clock 102, which provides input to FEC decode and buffer 104 on data line 99. In contrast to the system 80 shown in FIG. 8, the receiver in the system 90 is only gating the received signal to reassemble the sequence (hence the buffer). It is not declaring erasure locations to aid the decoder.

FIG. 10 illustrates a system, generally indicated at 100, that combines the control of data at the transmitter as described above with respect to FIG. 5 with the FEC of FIG. 9, in accordance with one embodiment. Data transmission on data line 103 is controlled at MAC/PHY 111 based on pulse power transitions (as described above with respect to FIG. 5) and FEC 110 is used to protect the remaining data (as described above with respect to FIG. 9). The pulse power at line 101 is used to indicate pulse power transitions at controller 116, which provides input at MAC/PHY 111 to hold the data based on the pulse power transitions. FEC block 110 protects the remaining data transmitted at multiplexer 105. The data and power are transmitted on single wire pair 106 and received at demultiplexer 107. At the receiver, pulse power line 108 provides input at a gate receiver clock 112, which provides input to FEC decode and buffer block 113 on data line 109. As previously noted, the receiver is only gating the received signal to reassemble the sequence and is not declaring erasure locations to aid the decoder.

In one or more embodiments, an error rate on the FEC block receiver 104, 113 (FIGS. 9 and 10) may be used to indicate that there may be a fault in the wire. For example, an increase in FEC errors may indicate an issue with the wire in which case pulse power should be shut down (or the power changed to a lower setting). The PD 12 may provide information on FEC errors to the PSE 10 (FIG. 1) over bidirectional communications cable 14.

It is to be understood that the systems 40, 50, 60, 70, 80, 90, and 100 shown in FIGS. 4-10 are only examples and components may be added, removed, modified, or combined without departing from the scope of the embodiments. Also, it is to be understood that the term "controller" as used herein may refer to one or more components used to mitigate data errors during pulse power transitions at the PSE 10, PD 12, or both ends of the single wire pair. For example, a controller at the transmitter may include control block 42 and gate 44 (FIG. 4) or control block 116 and FEC block 110 (FIG. 10). A controller at the receiver may include, for example, the control block 62, 72 and mark or discard block 64, 74 (FIGS. 6 and 7) or the gate receiver clock 112 and FEC decoder/buffer 113 (FIG. 10) or any subset or combination of these components. As previously noted, the examples discussed above with respect to FIGS. 4-10 are described with respect to data transmitted from the PSE and received at the PD. As previously described, data may also be transmitted from the PD to the PSE, thus components shown in FIGS. 4-10 at the transmitter and receiver may be located at both the PSE and PD for use in transmitting or receiving data.

Also, as previously noted, pulse power may be transmitted and data transmitted or received over any number of wire pairs or phases. Each wire pair (or phase) transmitting pulse power and data may be associated with a circuit such as shown in FIGS. 4-10 to mitigate data corruption during pulse power transitions on the wire pair. One or more circuit components may be shared between wire pairs if pulse power is transmitted in a phantom power scheme (e.g., using a center tap such as in a PoE configured system shown in FIG. 21).

FIGS. 11A-11D are flowcharts illustrating an overview of processes for transmitting and receiving pulse power and data over a wire pair in SPE or multi-pair cable, in accordance with one or more embodiments.

Figure 11A:
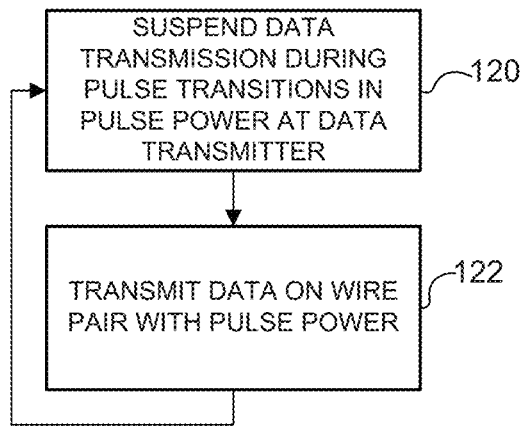
FIG. 11A is a flowchart illustrating an overview of a process for transmitting pulse power and data on the single wire pair with control of data transmission at the transmitter, in accordance with one embodiment.

Referring first to the flowchart of FIG. 11A, data transmission on a wire pair is controlled based on pulse power transmission timing at the data transmitter. At step 120, data transmission is suspended during pulse power transitions. For example, a controller (e.g., control block 42 and gate 44 in FIG. 4, control block 52 and MAC/PHY 54 in FIG. 5) may suspend transmission of data at the transmitter during identified power transitions (e.g., 0.5 ms period 34a shown in FIG. 3A). Data is transmitted on the wire pair carrying pulse power (i.e., pulse power transmitted or received) to the data receiver (step 122).

Figure 11B:
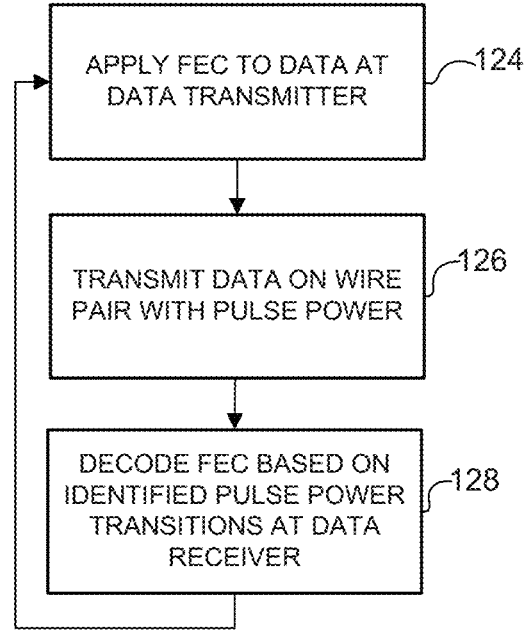
FIG. 11B is a flowchart illustrating an overview of a process for transmitting pulse power and data on the single wire pair with FEC, in accordance with one embodiment.

FIG. 11B illustrates a process for using FEC to mitigate corruption of Ethernet packets (data transmission) during pulse power transitions, in accordance with one embodiment. FEC is applied to data at the data transmitter (step 124). The data is transmitted to the data receiver on the wire pair carrying the pulse power (step 126). The power transitions are identified in the pulse power at the data receiver and data is decoded based on the identified power transitions (step 128). For example, data transmitted during the pulse power transitions may be decoded to identify possible error as described above with respect to FIG. 8. FEC may also be used to protect data that is not suspended during pulse power transitions at the PSE (remaining data), as described above with respect to FIGS. 9 and 10.

Figure 11C:
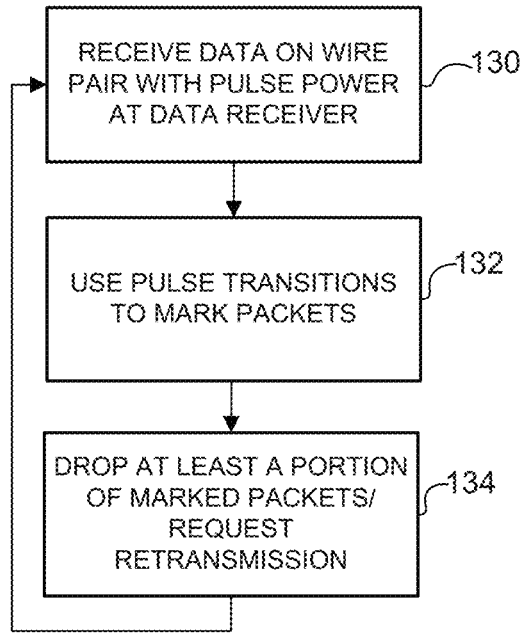
FIG. 11C is a flowchart illustrating an overview of a process for transmitting pulse power and data on the single wire pair with marking of packets at the receiver, in accordance with one embodiment.

FIG. 11C illustrates a process at the data receiver for preventing interference between the pulse power and data, in accordance with one embodiment. At step 130, data is received on the wire pair carrying pulse power at the data receiver. Pulse power transitions are identified and used to mark packets for possible error (step 132). At least a portion of the marked packets may be dropped or retransmitted or all of the marked packets may be dropped, as described above with respect to FIGS. 6 and 7 (step 134).

Figure 11D:
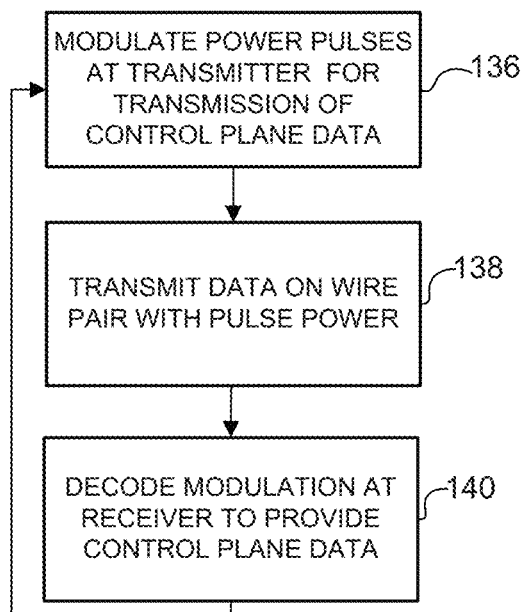
FIG. 11D is a flowchart illustrating an overview of a process for modulation of the pulse power for use in transmitting control plane data.

In one or more embodiments, modulation of the high voltage pulse power may be used in parallel with the SPE transmission for control plane data. For example, encode modulation may be added at the transmitter end with decoding at the receiver used to transmit control plane data. This would include the addition of decode components at the receiver end for the control plane data. FIG. 11D is a flowchart illustrating an overview of a process for transmitting control plane data, in accordance with one embodiment. At step 136, power pulses are modulated at the PSE to provide control plane data. The data is transmitted on the wire pair with the control plane data superimposed on the power signal (step 138). The modulated power pulses are decoded at the powered device to provide the control plane data to the powered device (step 140). Any type of suitable modulation may be used (e.g., PWM (Pulse Width Modulation), NRZ (Non-Return to Zero), or other modulation).

It is to be understood that the processes shown in FIGS. 11A-11D and described above are only examples and steps may be added, removed, modified, or combined without departing from the scope of the embodiments. For example, one or more of the steps of the processes shown in FIGS. 11A, 11B, 11C, and 11D may be combined with one or more steps from another of the processes shown in a different flowchart. For example, FEC shown in steps 124-128 of FIG. 11B may be added to the process shown in FIG. 11A. Also, as noted above, the cable may comprise a multi-pair cable and the process may be performed on one or more wire pairs.

As previously discussed, the pulse power system may operate as a multiple phase (multi-phase) system. The processes described above with respect to FIGS. 11A-11D may be performed for each phase (wire pair) in a multi-phase pulse power system. In one example, the single conductor pair cable is replaced with a two-phase pulse power transmission system cable with two pairs of power lines, busbars, power planes, or cable wired pairs. The multi-phase pulse power comprises a plurality of voltage pulses carried on at least two wire pairs with the voltage pulses on the wire pairs offset between the wire pairs to provide continuous power. As described below with respect to FIG. 13, pulse-on time of the voltage pulses may overlap between the wire pairs. In one or more embodiments, the multi-phase approach allows for a sufficient pulse-off time to verify the cable for shorts, opens, unreported power loss (e.g., low current short), or human or animal added resistance. This extended pulse-off time allows for a significant improvement in safety. The multi-phase pulse power also allows for a lower source voltage to be used to meet 100% of the powered device requirements. Use of multiple phases at a higher duty cycle and higher efficiency provides a significant component advantage and may also provide increased power delivery and reliability. For example, the loss of a single phase in a three or more phase system may not significantly impact the 100% continuous duty cycle power effectivity at the powered device.

Figure 12:
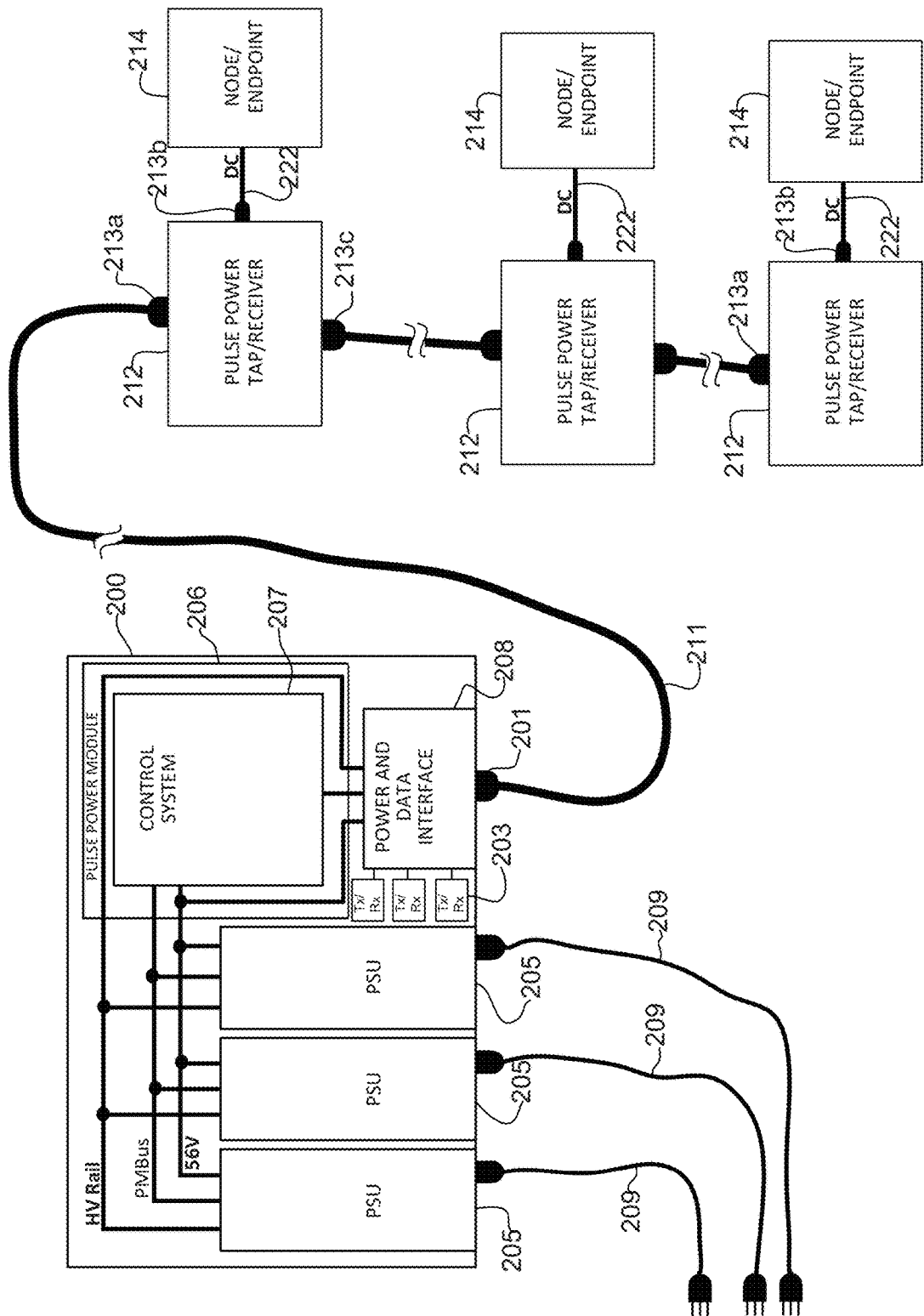
FIG. 12 is a block diagram illustrating an example of a multi-node three-phase pulse power system, in accordance with one embodiment.

Referring now to FIG. 12, a multi-node multi-phase pulse power system is shown, in accordance with one embodiment. The simplified example shown in FIG. 12 includes a PSE node 200 delivering power to three or more PDs (e.g., pulse power receiver (tap/receiver) 212 and node endpoint 214). In this example the pulse power tap/receiver 212 is separate from the endpoint equipment 214, however, these nodes may be combined. Also, there may be more than one node 214 connected to one or more of the pulse power tap/receivers 212.

The PSE network device 200 comprises an input power interface (e.g., three PSUs 205 coupled to power cords 209 in the example shown in FIG. 12) for receiving input power, a power control system 207 for receiving the input power and transmitting DC pulse power on multiple phases over a multi-phase cable 211 (at PSE port 201) to a plurality of the powered devices (receivers) 212, 214 and verifying cable operation within pulse-off time in the DC pulse power, and a cable interface (e.g., power and data interface 208) for delivery of the multi-phase DC pulse power and transmitting or receiving data over the cable 211. The power and data interface 208 is coupled to the power control system 207 and configured to transmit the multiple phases of voltage pulses, each associated with one or more data signals, to the multi-pair cable 211 connected to the port 201. In the example shown in FIG. 12, the PSE 200 includes three transceivers (Tx/Rx) 203 in communication with the power and data interface for transmitting or receiving data with each of the three pulse power phases on the cable 211. It is to be understood that there may be a different number of transceivers than phases with one or more wire pairs only transmitting power or only transmitting/receiving data. The transceivers 203 are coupled to a data control system, which is in communication with the power control system 207 or the power circuit.

The pulse power receiver 212 comprises an input cable interface 213a for receiving the multiple phase pulse power and data from the PSE 200, an isolation switch (e.g., modulator switch shown in FIGS. 18A, 18B, 19A, 20, and 21 and described below), and an interface 213b for transmitting power to the endpoint node 214. The PD modulator switch isolates the cable during the pulse-off time when a PSE high voltage modulator switch is off, to allow for high voltage shock safety auto-negotiation of cable capacitance voltage open circuit test of a discharge dv/dt proportional to the resistance across the cable pair that may be, for example, a human body resistance.

The interface 213b may be, for example, an interface connected to HVDC (high voltage DC) cable 222, pulse power cable, or a direct interface to the endpoint node. The receiver 212 may supply power to one or more nodes 214 along a pulse power cable system. One or more of the pulse power tap/receivers 212 may also comprise an output cable interface 213c for transmitting the multiple phase DC pulse power and data on the cable to a downstream tap node 212 in a taper topology (tap node configuration). The receivers 212 may be sized to support individual node power and may implement disconnect for fault isolation or node control based on data link communications. The multi-phase DC pulse power comprises at least two phases to provide continuous voltage at the endpoint node 214. In one or more embodiments, the multi-phase pulse power comprises at least three phases to provide continuous power in case of loss of one phase. The pulse power receivers 212a also comprise transceivers (not shown).

In the example shown in FIG. 12, the PSE 200 comprises three PSUs 205 and a pulse power module 206 comprising the control system 207. As shown in FIG. 12, each PSU 205 may be in power communication with the pulse power module 206 over a high voltage rail, PM (Power Management) bus line, 56V line, or any combination thereof. In one example, each PSU 205 is configured for 1200 W power to provide redundancy and allow for the use of standard 15 A (amp) power cords/branch circuits. In one example, the PSE 200 is operable to deliver >1500 W total power to the nodes 214. In one example 190V line-to-ground (380V total) is used to eliminate the need for intermediate power conversions.

The multiple PSUs 205 allow for multi-phase operation (continuous power) and may also provide redundancy. For example, if one phase is lost in a system comprising three or more phases, continuous power may still be delivered to the PD nodes 214. Each phase is preferably sized to supply higher peak power to maintain full power to the PD nodes 214. Further redundancy may be provided by utilizing N+1 Front End Power (FEP) supplies. For example, in the case of a 1500 W total PD power system, three 1200 W FEPs can power the system with full redundancy of N+N or N+1, with each FEP needing only a common 120V, 15 A feed.

The pulse power module 206 may include a pulse power modulator, safety circuits, initialization circuits, PMBus, PMBus I2C ($I^2C$ (Inter-Integrated Circuit)), logic, FPGA (Field-Programmable Gate Array), DSP (Digital Signal Processor), or any combination of these or other components configured to perform the functions described herein.

The power control system 207 provides a multiphase of voltage pulses. The pulse power module control system 207 may provide, for example, timing and sequencing, line detection and characterization, voltage and current sensing, mid-point high resistance grounding, fault sensing, communications to PSUs, and data link/control to remote nodes. In one or more embodiments, the control system 207 may verify cable operation (e.g., verify cable operational integrity) during the pulse power pulse-off time. In one or more embodiments if a phase is lost, the pulse power control system 207 may adjust power transmitted by remaining phases or a duty cycle of one or more of the remaining phases.

As shown in the example of FIG. 12, the PSUs 205 receive AC power on cables 209 and deliver pulse power on cable 211. Power and data are simultaneously transmitted over the multi-pair cable 211. The multi-pair cable 211 may comprise any number of conductors, twisted pairs (with or without shielding), or a coaxial or triaxial cable, depending on EMC considerations. A separate ground conductor may be provided to address potential common-mode noise issues. As described below with respect to FIGS. 16 and 17, the multi-phase pulse power system may comprise any number of wires, which may be bundled with fiber or other communications transmission media. For example, the pulse power cable 211 may include two or more optical fibers for delivering optical data in the combined power and data cable. In one example, there may be a dedicated fiber (or fibers) per branch.

In one or more embodiments, the pulse power tap/receiver 212 may combine the phases and deliver high voltage (HV) DC power to the node/endpoint 214 on cable 222. In another embodiment, the pulse power tap/receiver 212 may deliver pulse power to the endpoint 214 on the cable 222. Also, as previously described, the pulse power receiver 212 may also be in communication with one or more endpoints 214 over PoDL or PoE.

Power is supplied to the endpoint 214 through the pulse power tap/receiver 212 (also referred to as a branch tap, smart branch tap, receiver, converter). In one or more embodiments, the smart branch taps 212 allow branch fault isolation. The tap/receiver 212 may include, for example, an isolation switch (disconnect switch), data link, and logic/timing controller. The tap/receiver 212 may be used for initializing an auto-negotiation process, fault branch isolation algorithm, power initialization, and faulty PD replacements. The data link over the pulse power wires allows for implementation of the smart branch taps 212 for each node 214 and independent control (disconnect) of each branch for fault isolation or node management.

Each of the endpoints 214 may include an HVDC PSU for powering equipment at the endpoint. The endpoint 214 may comprise, for example, a 56 VDC load and may operate, for example, as a PON (Passive Optical Network) endpoint, 5G node, access point, router, switch, or other type of equipment. The endpoint 214 may also power one or more other nodes (e.g., PoE node, IoT (Internet of Things) device), as previously noted.

It is to be understood that the system shown in FIG. 12 is only an example, and the system may comprise any number of PSUs 205 (e.g., two or more) for providing multi-phase pulse power. The network topology and nodes shown in FIG. 12 is only an example and the network may comprise different topologies and network devices without departing from the scope of the embodiments.

Figure 13:
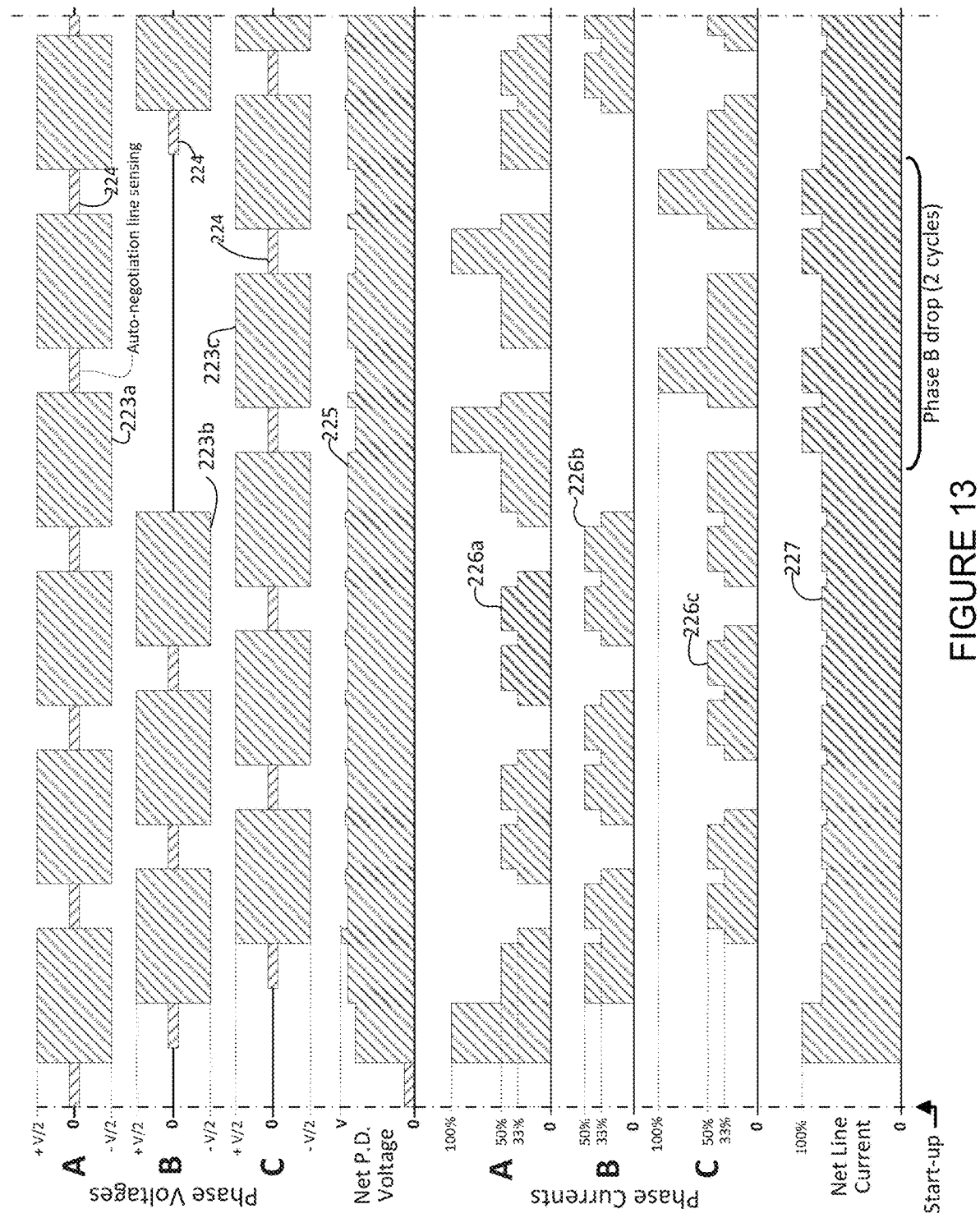
FIG. 13 illustrates an example of three-phase pulse power voltage and current for the system shown in FIG. 12 with constant power loading from endpoint nodes.

FIG. 13 illustrates an example of three-phase pulse power voltage and current with a 75% duty cycle with phase drop, delivered in the system shown in FIG. 12, for example. As shown in FIG. 13, the multi-phase pulse power comprises a plurality of voltage pulses, with each sequence of voltage pulses forming a phase of the multi-phase pulse power. The sequence of voltage pulses includes a high-state (pulse-on) 223*a*, 223*b*, 223*c* within an on-time duration alternating with a low-state (pulse-off) 224 within an off-time duration. The phases are offset from one another (phase shifted duty cycle) and interleave with each other (with overlap) by a phase shift (e.g., 120 degree phase shift or any other phase shift) to provide continuous power, as shown at net PD voltage 225 and net line current 227. As shown in the phase voltage traces, the phases A, B, C on each wire pair may overlap one another and operate independent from one another with no significant interference between the individual phases.

The three phase voltages (A, B, and C) each comprise pulse-on time (223*a*, 223*b*, 223*c*) in which high voltage power is delivered and pulse-off time 224 in which auto-negotiation line sensing 224 may be performed. For example, during pulse-on time 223*a*, 223*b*, 223*c* high voltage power is delivered from the PSE to the PDs and during pulse-off time 224 while the high voltage power is off, a low voltage may be applied on each phase for use in low voltage sensing to check wire integrity, test capacitance in the cable, or any other testing or fault detection.

In one or more embodiments, the pulse-off time 224 may be fixed, based on worst case cable length and characteristics or actively controlled based on detected cable characterization (for higher efficiency/longer range). The pulse-on time (power delivery) for each phase may be fixed based on total pulse power voltage and shock hazard limits based on appropriate body resistance data. This approach may be used to achieve maximum pulse overlap, thereby reducing cable RMS current and maximizing power transmission distance (or minimizing conductor wire size).

The net PD voltage is shown combined for the three phase voltages at 225. The corresponding phase currents (A, B, C) (226*a*, 226*b*, 226*c*) are shown below the voltages. The net line current corresponding to the three phase currents is shown at 227. In the example shown in FIG. 13, phase B drops out for two cycles. As shown in FIG. 13, when one phase is lost, continuous power is still delivered to the PD nodes. Each phase may be sized to supply higher peak power to maintain full power to the PDs. As previously noted, one or more of the remaining phases may be modified (e.g., voltage, current, or duty cycle adjusted) during a phase drop, as needed.

Idealized waveforms are shown and net PD voltage and line current include line loss effect with constant power loading from the nodes/endpoints 214 (FIGS. 12 and 13). Inductance in the PSE 200, cable 211, and PD receiver 212 may create some averaging of cable currents, raising overlap currents and lowering current during pulse-off time. This effect may vary with cable length and type (inductance).

Two or more transmission wires (e.g., wires or wire pairs) enable phasing of the conduction on each wire (e.g., wire or pair) so that at least one wire is ON (pulse-on) at any time. When OR'd at the PD, the result is continuous DC voltage as shown at 225, thereby eliminating the need for bulky filter components. During phase overlap in the multi-phase systems, the total cable current is shared across all ON wires. Individual transmission wire current is proportionally reduced, lowering total transmission cable losses.

The off-pulse (low-state) may be a small voltage (e.g., close to 0V, 3V), or any value that is significantly less than the pulse-on (high state) (e.g., at least 170V difference between voltage levels for pulse-on and pulse-off). The pulse-on time and pulse-off time (pulse width, pulse duty cycle) may be selected based on system design (e.g., number of phases, amount of power delivered) and safety requirements. The pulse duty cycle may also vary between an initialization phase, synchronization phase, testing phase, or normal operation. In one example, a start-up duty cycle may comprise 8 ms pulse-on and 4 ms pulse-off for a 12 ms time period (e.g., as shown in FIG. 3B). In another example, the pulse-on time may be only 0.5 ms or 1 ms during high voltage initialization. In one example, the pulse-off time may be 1 ms (e.g., as shown in FIG. 3A), which may include a resistance analysis and auto-negotiation time of 100 μs. In another example, a 2 ms to 4 ms pulse-off time (between power pulses) may be needed to properly assess environmental safety within a 10 ms time window (e.g., period ≤12 ms).

As previously described with respect to FIGS. 3A and 3B, a transition edge (transition time) occurs between pulse-off (low-state, off-time duration) 224 and pulse-on (high state, on-time duration) 223a, 223b, 223c and between pulse-on and pulse-off. In order to prevent interference between the pulse power and the data (mitigate corruption of data) during the transition, transmission of data (data signal) may be delayed during the transition from pulse-off to pulse-on, from pulse-on to pulse-off, or both transitions at the transmitter or determined at the receiver after a delay during the transition. Data may be transmitted by the transmitter and received by the receiver between the transitions (e.g., during pulse-on and pulse-off times). For simplification, the transition between pulse-on and pulse off and between pulse-off and pulse-on in FIG. 13 is shown as a sharp transition edge. As previously described, the transition may be represented by a sloped line or curve and may occur over a transition time period (e.g., 0.5 ms or any other time period).

In one or more embodiments, a central controller (e.g., control system 207 in FIG. 12) at the PSE may coordinate offset between phases and adapt pulse width for optimization (or following loss of a phase as needed). Any changes in pulse timing are preferably communicated to the PD for synchronization. In one or more embodiments, the PSE may adjust power transmitted by remaining phases during interruption of the transmission of one phase of the multi-phase pulse power. One or more of the remaining phases may be modified by adjusting voltage or current transmitted by the remaining phases or adjusting the duty cycle of one or more phases.

Figure 14A:
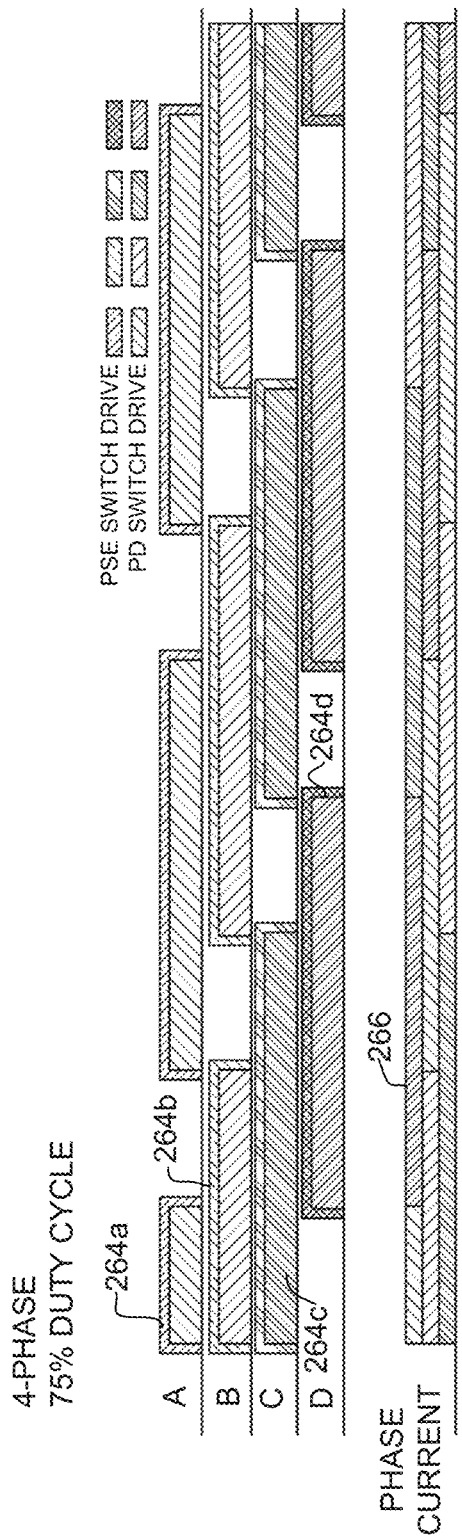
FIG. 14A is a simplified schematic showing pulses at power sourcing equipment and a powered device and current at the powered device for a four-phase pulse power system.
Figure 14B:
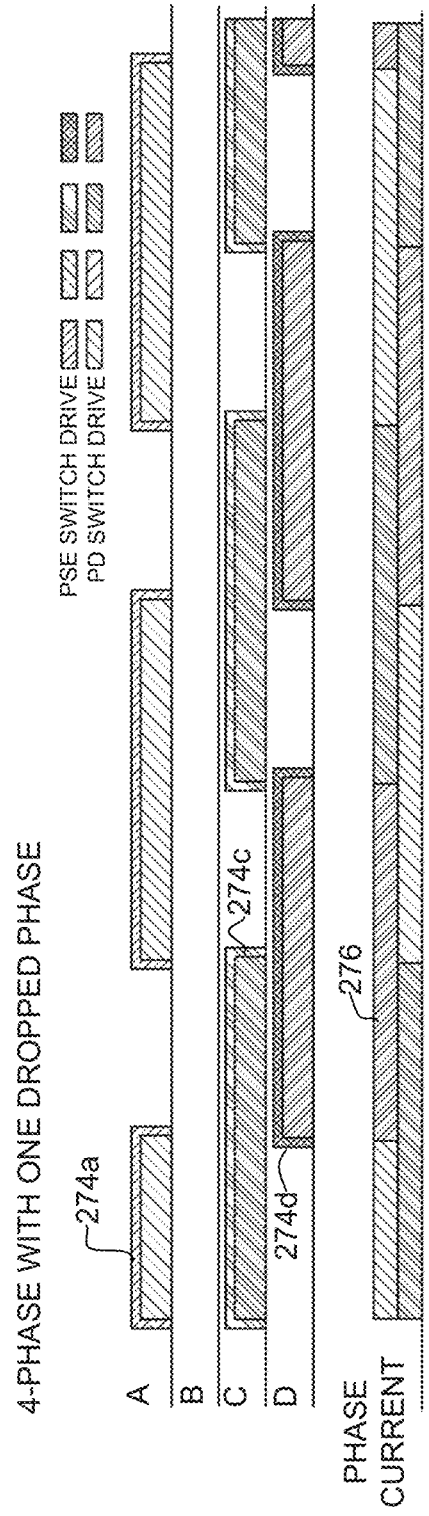
FIG. 14B shows the four-phase pulse power of FIG. 14A with one phase dropped, showing a compensating shift in pulse duty cycle and phasing to maintain continuous powered device current.

As previously noted, the pulse timing may be synchronized between the PD and PSE. In one or more embodiments, PD and PSE modulators (described below with respect to FIGS. 18A and 18B) may be synchronized during low voltage or high voltage initialization or during high power operation for each phase in a multi-phase system. In one or more embodiments, PSE and PD modulator (control) switches may include timing control such that a PSE pulse is turned on before a PD modulator switch is turned on, and PD modulator switch is turned off before the PSE modulator switch is turned off for each pulse, as shown in FIGS. 14A, 14B, and 19B and described below. This may be used to minimize transients on the distribution system, thereby reducing EMI and producing cleaner current waveforms for more accurate current detection.

FIGS. 14A and 14B illustrate simplified voltage waveforms and phase current in a four phase system, in accordance with one embodiment. FIG. 14A illustrates four phase 75% duty cycle operation. Voltage pulses are shown at 264a for phase A, 264b for phase B, 264c for phase C, and 264d for phase D. The cumulative phase current is shown at 266. As shown in FIG. 14A, the PSE switch drive is turned on before the PD switch drive at the start of the pulse and at the end of the pulse, the PD switch drive is turned off before the PSE switch drive for each phase. As shown in FIG. 19B and described below, the transition time may cover the transition at both the PSE and PD.

FIG. 14B illustrates operation with one dropped phase (phase B). Voltage pulses are shown at 274a for phase A, 274c for phase C, and 274d for phase D. The cumulative phase current is shown at 276. As can be seen in FIG. 14B, continuous power is still provided, even with loss of phase B by adjusting the relative timing of the three functional phases.

It is to be understood that the currents, voltages, pulse widths, duty cycles, and phase overlaps shown in FIGS. 13, 14A, and 14B and described above are only examples and may be different than shown or described herein. For example, there may be a higher pulse current during overlap and lower current during non-overlap. The differences may be dependent on pulse power transmission inductance and capacitance (e.g., length of run or type of cable), for example.

It is to be understood that the multi-phase pulse power system described herein may be implemented on systems comprising a different number of wires or wire pairs and the three-phase system shown in FIGS. 12 and 13 and four-phase system shown in FIGS. 14A and 14B are only examples. The pulse power system may operate with any number of phases (e.g., two, three, four, etc.), without departing from the scope of the embodiments. The number of phases may be increased (while maintaining phase shifting) to further reduce individual wire currents, extend transmission distance, add redundancy, or any combination thereof. Also, as previously noted, the cable may include any number of optical fibers or additional copper wires for data transmission, as described below with respect to FIGS. 16 and 17.

Figure 15A:
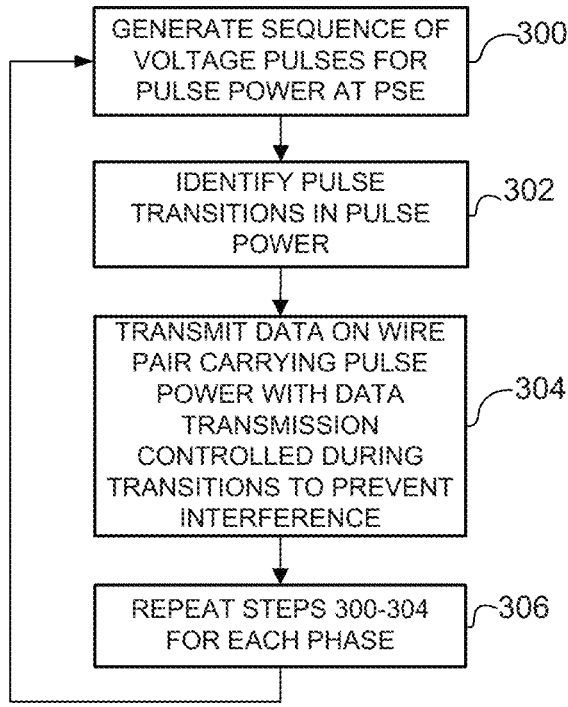
FIG. 15A is a flowchart illustrating an overview of a process for transmission of data on a wire pair carrying pulse power in the multi-phase system, in accordance with one embodiment.

FIG. 15A is a flowchart illustrating an overview of a process for transmitting data on wire pairs carrying multiple phases of pulse power, in accordance with one embodiment. At step 300, a sequence of voltage pulses are generated for pulse power at the PSE. As previously described, the pulse power comprises a plurality of voltage pulses on one or more wire pairs. In one or more embodiments, the voltage pulses on the wire pairs are offset between the wire pairs to provide continuous power. Transition times between at least one of a pulse-on time and a pulse-off time, and a pulse-off time and a pulse-on time are identified on at least one wire pair (step 302). The data is transmitted on the wire pair carrying the pulse power with the data transmission controlled (e.g., delayed) on the wire pair during the identified transitions on the wire pair to prevent interference between the pulse power and the data (e.g., prevent corruption of the data due to the transitions in the voltage pulses) (step 304). Steps 300-304 are repeated for each phase of the multi-phase system.

Figure 15B:
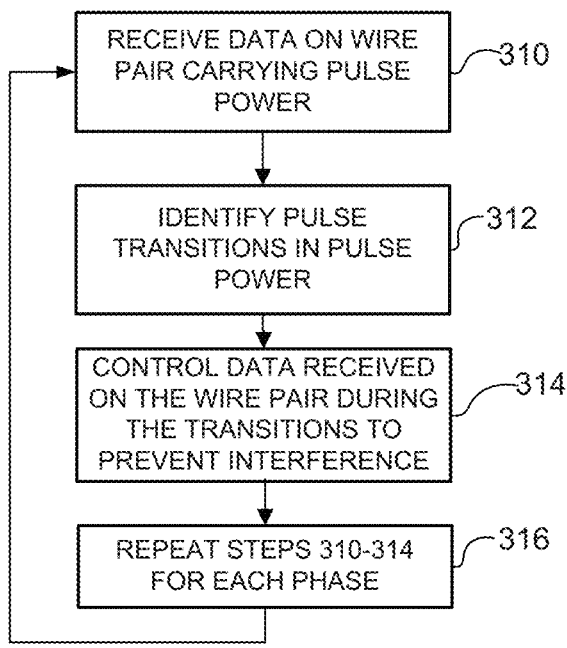
FIG. 15B is a flowchart illustrating an overview of a process for receiving data on the wire pair carrying pulse power in the multi-phase system, in accordance with one embodiment.

FIG. 15B is a flowchart illustrating an overview of a process for receiving data on wire pairs carrying multiple phases of pulse power, in accordance with one embodiment. At step 310 data is received on the wire pair carrying pulse power. Transition times are identified between pulses (step 312). The data is controlled (e.g., modified, marked, dropped, FEC applied) during the identified transition times to prevent interference with the data (steps 314). Steps 310-314 are repeated for each phase of the multi-phase system.

It is to be understood that the processes shown in FIGS. 15A and 15B are only examples and that steps may be added, removed, combined, or modified, without departing from the scope of the embodiments.

Figure 16:
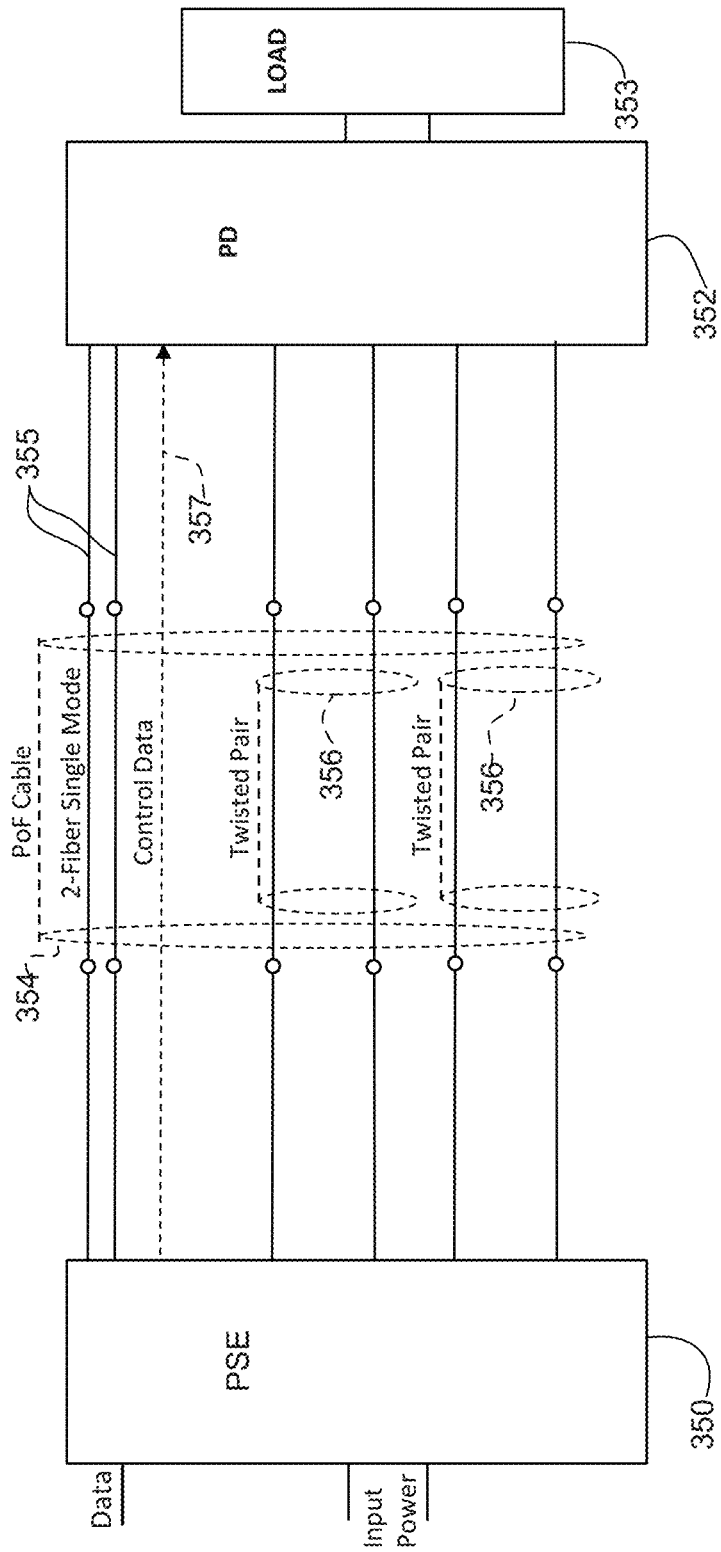
FIG. 16 shows a cable with optical fibers and two wire pairs connecting power sourcing equipment to a powered device for delivery of multi-phase pulse power, in accordance with one embodiment.
Figure 17:
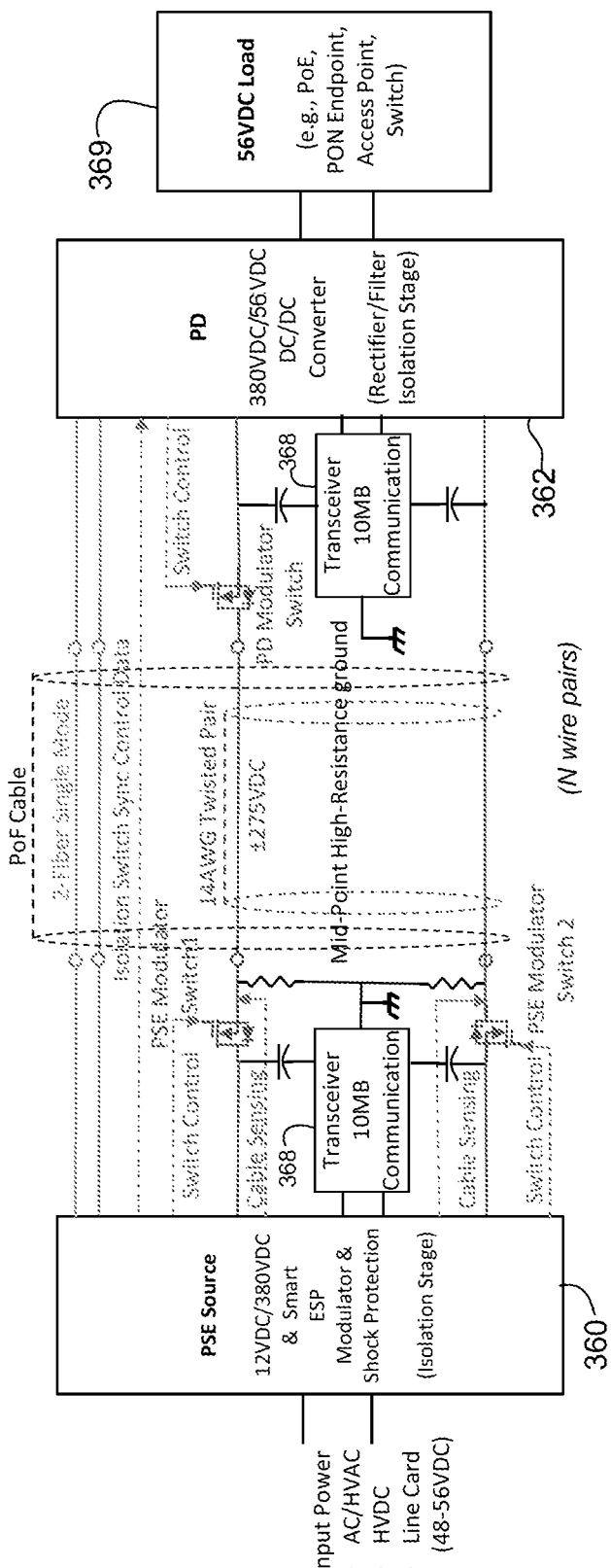
FIG. 17 illustrates details of one of the wire pairs shown in FIG. 16, in accordance with one embodiment.

FIGS. 16 and 17 illustrate simplified examples of extended safe power (ESP) systems for delivering power on a copper pair with a data fiber pair. As previously noted, the extended safe power may be delivered on a combined cable with one or more optical fibers for optical data delivery in one or more embodiments. FIG. 16 is a simplified block diagram showing a cable 354 extending between a PSE 350 and PD 352 and carrying two twisted pairs 356 and optical fibers 355. FIG. 17 is a block diagram illustrating additional functional components at a PSE 360 and PD 362 for a single twisted pair.

Referring first to FIG. 16, a simplified example of a data and power delivery system comprising the PSE 350 in communication with the PD 352 providing power to a load 353, over a combined power and data cable (e.g., Power over Fiber (PoF) cable) 354 is shown. In this example, the cable 354 includes two optical fibers 355 (e.g., 2-fiber single mode) and two twisted pairs 356 (e.g., copper wires). Control data shown at 357 may be delivered over the optical fibers 355 or copper wires (twisted pairs) 356, or a separate transmission line. The control data may comprise, for example, isolation switch synchronization, control data, modulator switch control data, bidirectional control data, or other PSE/PD synchronization data. Bidirectional communications data may also be transmitted over the optical fibers 355 or wires 356. In one example, 10 MB communications are provided over the copper pair during a high voltage pulse (pulse-on) and low voltage (pulse-off) on the high voltage data link. Input power (e.g., AC, HVAC, HVDC, line card 48-56 VDC) may be provided at the PSE 350. The cable 354 may comprise any number of optical fibers and wires or wire pairs for delivering data and high voltage pulse power over different cable lengths.

In one or more embodiments, PoE, PoDL, or high voltage power (e.g., ESP, pulse power, multi-phase pulse power) may be delivered over the same cable and connectors. Depending on a capability of the PSE 350 and PD 352, the PD may operate in one or more different modes. If the PSE 350 and PD 352 are not compatible (i.e., one only configured for PoE and the other one only configured for ESP) the circuit will be not be powered. If both the PSE 350 and PD 352 are capable of ESP operation, the PSE will supply high voltage pulse power and the PD will operate using the high voltage pulse power. In another example, the PSE 350, PD 352, or both PD and PSE may select an operating mode based on the most efficient delivery mode (e.g., using auto-negotiation between PD and PSE).

FIG. 17 illustrates additional details of one of the twisted pairs shown in FIG. 16, in accordance with one embodiment. A PoF (Power over Fiber) cable extends between the PSE 360 and PD 362. In this example, the PD 362 powers a 56 VDC load 369 (e.g., PoE, PON (Passive Optical Network) endpoint, access point, switch). In the simplified example shown in FIG. 17, the cable includes two optical fibers and one twisted pair. As previously described, the cable may comprise any number of wire pairs (e.g., N wire pairs). In this example, the system provides high resistance mid-point grounding for shock protection. In one example, mid-point grounding drops the line to ground voltage (e.g., 275V line-to-ground, 550V line-to-line; 190V line-to-ground, 380V line-to-line). In one or more embodiments, both feed and return of each transmission pair is switched to implement effective control and line-to-ground fault detection is between 10-100 µs. As previously described, cable sensing may be provided at the PSE 360. The system may provide line-to-ground (GFI (Ground Fault Interrupters)) shock protection and line-to-line shock protection for any cable fault condition during auto-negotiation with high-voltage pulse off-time, as described above. The PD 362 may comprise one or more rectifiers configured to convert the voltage pulses into one or more direct current voltages. One or more embodiments provide single point of failure and redundancy for any high-voltage path to cable. In one or more embodiments, the system may use 12-56 VDC low voltage for initial start-up conditions and default condition to establish data link and safety interlock before enabling high voltage operation, as previously described. In one example, 10 MB communications are provided over the twisted pair as shown at transceiver 368.

Figure 18A:
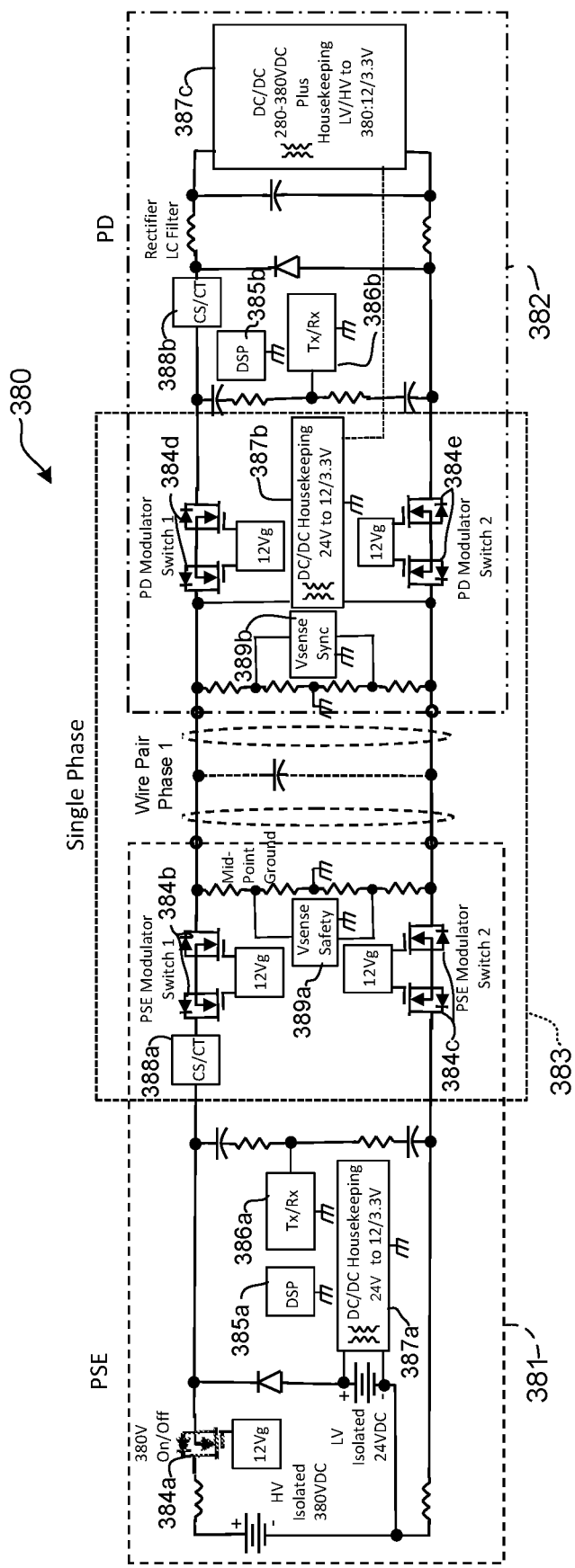
FIG. 18A is a block diagram illustrating a system for delivering pulse power and data on a wire pair, in accordance with one embodiment.
Figure 18B:
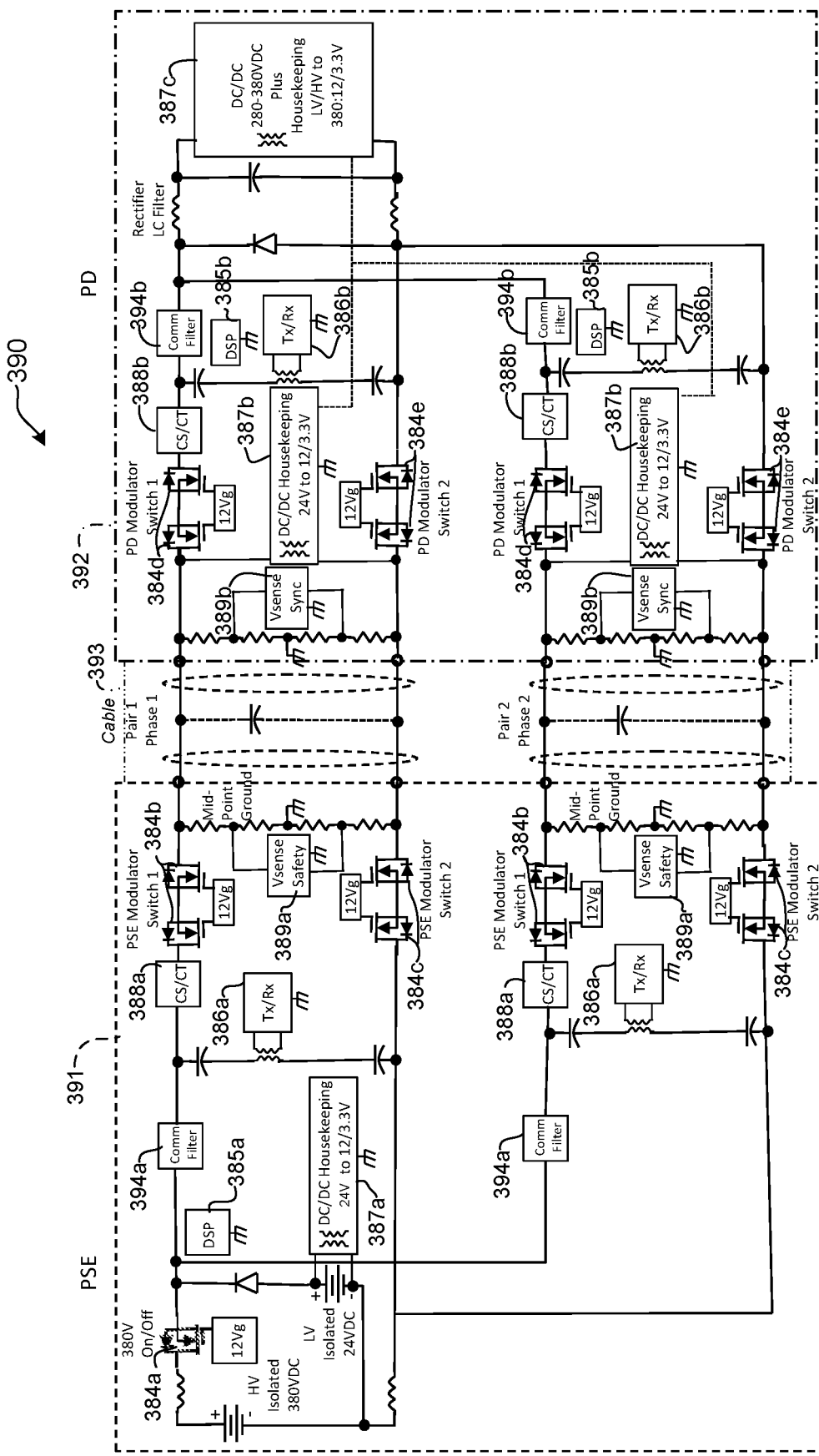
FIG. 18B is a block diagram illustrating a multi-phase pulse power system for delivering pulse power and data on multiple wire pairs, in accordance with one embodiment.

FIGS. 18A and 18B illustrate simplified block diagrams of the extended safe power system, in accordance with one embodiment. FIG. 18A shows the system for a single phase and FIG. 18B shows two phases. As previously described, the ESP system may include any number of phases.

Referring first to FIG. 18A, the block diagram illustrates circuits for power sourcing equipment 381 providing a power source and smart control and a powered device 382 comprising, for example, a PON (Passive Optical Network) endpoint. The components shown within block 383 represent a single phase and may be duplicated for each phase of a multi-phase system. For example, modulator switches 384b, 384c, 384d, 384e, sensing components 389a, 389b, and start up power circuit 387b may be duplicated for each cable pair/phase, as described below with respect to FIG. 18B.

The PSE 381 includes an isolated high voltage source (e.g., 380 VDC) and a modulator switch 384a with gate. The DSP (Digital Signal Processor) 385a, 385b at the PSE and PD may comprise a microcontroller or FPGA (Field Programmable Gate Array) digital control and software/firmware. Tx/Rx 386a, 386b at the PSE and PD represent transceivers with a coupling network. An isolated power supply 387a is provided for PSE housekeeping and the isolated power supply 387b is provided for PD housekeeping with 24 VDC input, for example, for low voltage initialization and testing. The PD 382 also includes a rectifier LC filter and a DC/DC isolated converter 387c for generating 12V/3.3V housekeeping voltage with 60-380 VDC input from the output of the PD (high voltage pulse power operation), for example. In the example shown in FIG. 18A, current sense transformer/Hall-effect sensors (CS/CT) 388a, 388b are included at the PSE and PD. A safety sensing circuit (Vsense safety) 389a and PD sync voltage sensor (Vsense sync) 389b are located in the PSE and PD, respectively. In the example of FIG. 18A, the PSE 381 includes two PSE modulator switches 384b, 384c, and the PD 382 includes two PD modulator switches 384d, 384e, shown as bidirectional switches to totally isolate the wire pair during high voltage pulse-off time for accurate voltage droop sensing proportional to RC time of a body resistance across the cable during the auto-negotiation safety test between high voltage pulses. In one or more embodiments, the PD 382 may only include one modular switch. The switches may comprise, for example, a solid state switch or any other suitable device to provide pulse power modulation, which is synchronized between the PSE 381 and PD 382. The switches 384a, 384b, 384c, 384d, 384e may comprise any suitable actively controlled switching device capable of operating at the desired switching frequency, such as a Metal Oxide Semiconductor Field Effect Transistor (MOSFET), a Bipolar Junction Transistor (BJT), a Gallium Nitride Field Effect Transistor (GaNFET), or a solid state relay (SSR). Closing and opening of the switch may be managed by control logic coupled to the switch, which may be part of a processor, controller, or a separate integrated circuit.

FIG. 18B illustrates an example of an ESP system 390 for two-phase pulse power. Two wire pairs/phases (pair/phase 1, pair/phase 2) on cable 393 extend between a PSE 391 and PD 392. The wire pairs may be shielded, for example. A communications filter 394a, 394b may be provided at the PSE 391 and PD 392, respectively, for each phase. Each phase includes its own transceivers 386a, 386b, CS/CT 388a, 388b, modulator switches 384b, 384c, 384d, 384e, and Vsense circuits 389a, 389b at the PSE 391 and PD 392. Each phase may also include the low voltage housekeeping circuit 387b. It may be noted that separate housekeeping circuits are not needed if line redundancy is not needed. The pulse power for each phase is combined at the PD 392 to provide continuous uninterrupted power to the output with overlapping phase pulses, as previously described.

Each phase may further include one of the circuits shown in FIGS. 4-10 with components at the PSE, PD or both PSE and PD, for use in identifying pulse transitions in the pulse power and controlling the data (e.g., suspending data transmission, modifying the data) based on the location of the transition edge, as previously described. For example, the transceivers 386a, 386b shown in FIGS. 18A and 18B may be coupled to any of the data control components (controller, gate, buffer, Rx clock, FEC decoder, etc.) shown in FIGS. 4-10 for use in avoiding or modifying data transmission during pulse power transitions, as previously described. The data control components may receive input from one or more of the modulator switches 384b, 384c, 384d, 384e, a modulator switch controller, or voltage or current downstream from the switches for use in identifying pulse power transitions. Input may be received only at the start of the transition (with a specified period to cover the transition) or input may also be provided at the end of the transition.

Figure 19A:
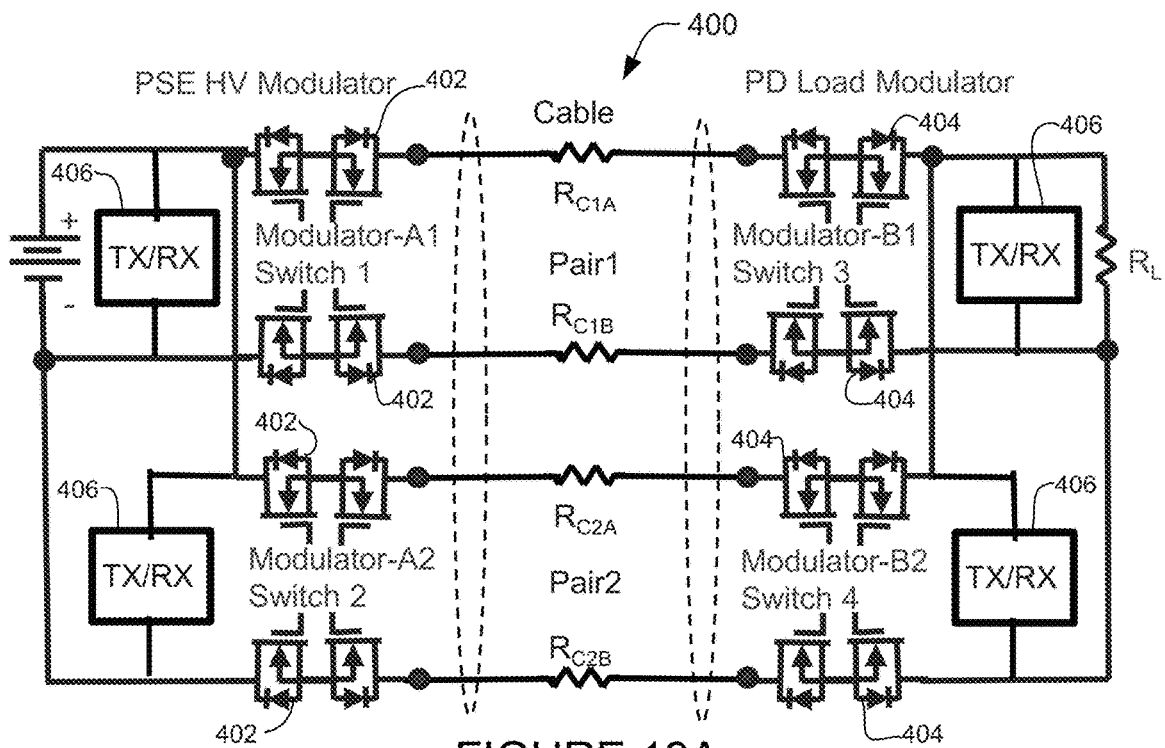
FIG. 19A is a simplified block diagram of the multi-phase pulse power system shown in FIG. 18B, in accordance with one embodiment.
Figure 19B:
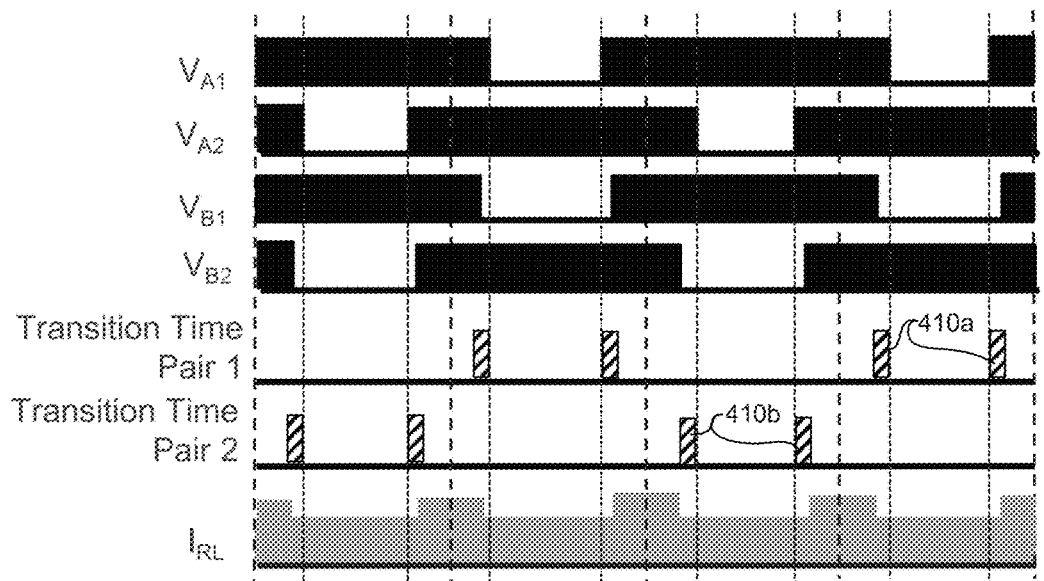
FIG. 19B is a timing diagram for the multi-phase pulse power system shown in FIG. 19A.

FIG. 19A illustrates a simplified example of a circuit 400 with a two-phase, four-wire (Pair 1, Pair 2) cable for delivery of multi-phase pulse power and data, in accordance with one embodiment. FIG. 19B is a timing diagram for the circuit shown in FIG. 19A. As described above with respect to FIG. 18B, the PSE includes modulator switches 402 (modulator switches 1 and 2) for each phase (A1 for Pair 1, A2 for Pair 2) and the PD includes modulator switches 404 (modular switches 3 and 4) for each phase (B1 for Pair 1, B2 for Pair 2). Each phase also includes transceivers 406 at the PSE and PD for transmitting and receiving data on the wire pairs. Each wire pair in the cable includes resistance ($R_{C1A}$, $R_{C1B}$ at Pair 1, $R_{C2A}$, $R_{C2B}$ at Pair 2). $R_L$ represents the load at the PD.

The timing diagram shown in FIG. 19B illustrates voltage pulses (on/off cycling) at the modulator switches 402, 404 in FIG. 19A ($V_{A1}$ at modulator switch A1, $V_{A2}$ at modulator switch A2, $V_{B1}$ at modulator switch B1, $V_{B2}$ at modulator switch B2). In this example, a pulse current with >67% pulse duty cycle per phase is shown. As previously described with respect to FIGS. 14A and 14B, the switches may be synchronized at the PSE and PD such that the pulse width is slightly larger at the PSE ($V_{A1}$, $V_{A2}$) as compared to the corresponding phase at the PD ($V_{B1}$, $V_{B2}$). Current $I_{RL}$ in FIG. 19B shows the net line current at $R_L$ (net line current at PD) in FIG. 19A. Transition times 410a, 410b are shown in FIG. 19B for each pair (Pair 1, Pair 2). As previously described, the transition time 410a, 410b is the time at which the voltage pulse transitions from pulse-on (high-state) to pulse-off (low-state) or pulse-off to pulse-on. The embodiments described herein provide for mitigation of corruption of data during these pulse power transition times by controlling data at the transmitter, receiver, or both transmitter and receiver during the transition time 410a, 410b on each wire pair to allow for transmission of data on a wire pair carrying pulse power.

It is to be understood that the circuit shown in FIG. 400 and timing diagram shown in FIG. 19Bb are only examples and changes may be made without departing from the scope of the embodiments. For example, switches 404 may only be on one wire of the wire pair, as previously noted above with respect to FIG. 18A. Switches 404 on both wires are not needed to provide PD power redundancy, but may provide some level of safety test redundancy in case one wire is shorted or not turned off, and to allow total isolation of the cable, if needed.

Figure 20:
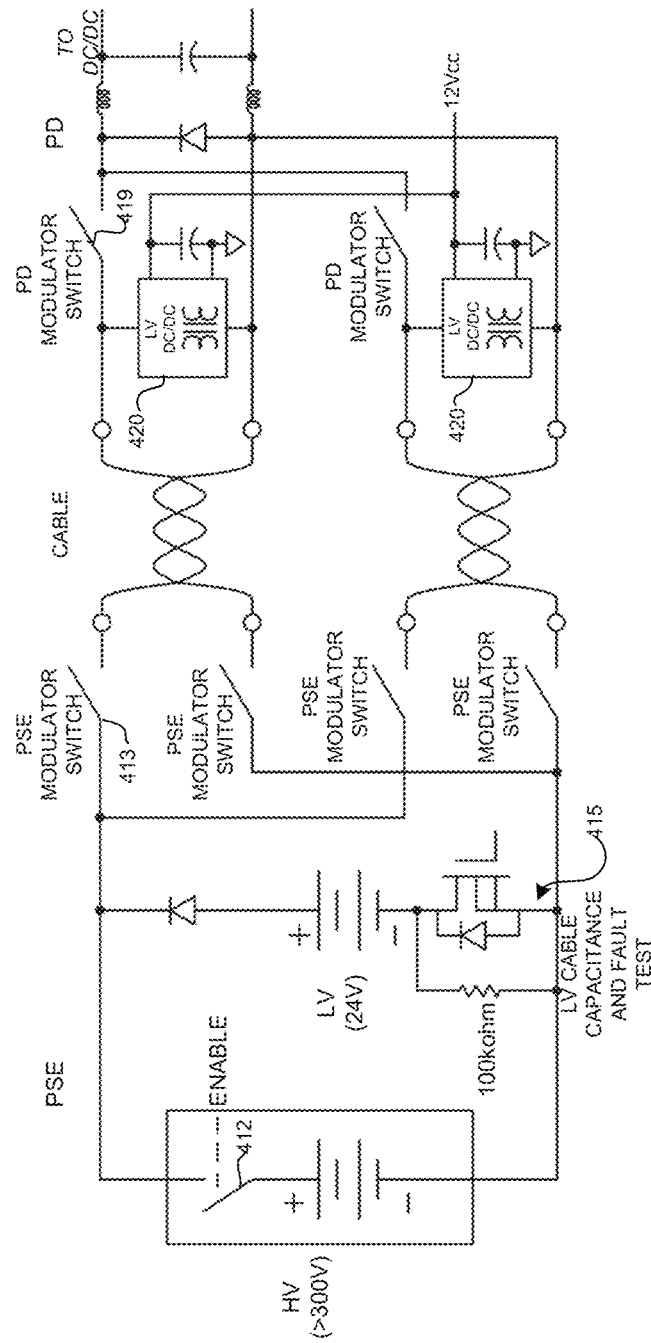
FIG. 20 is a simplified circuit of the multi-phase pulse power system shown in FIG. 19A, in accordance with one embodiment.

FIG. 20 illustrates a simplified circuit of the ESP system, in accordance with one embodiment. The circuit includes two twisted pairs with the PSE modulator switches 413 and PD modulator switches 419 shown for each pair. The enable switch 412 is open for low voltage initialization or testing and closed for high voltage operation (e.g., 380 VDC, >300V, >200 VDC). In one example low voltage operation (for start-up or testing) may be less than or equal to 56V (e.g., 24V). In the example shown in FIG. 20, the PSE includes a low voltage cable capacitance and fault test circuit 415. An alternate start-up power may be provided with a battery at the PD for initial power-up. The PD includes a low voltage DC/DC converter 420 for each wire pair for low voltage housekeeping during low voltage initialization, for example.

Figure 21:
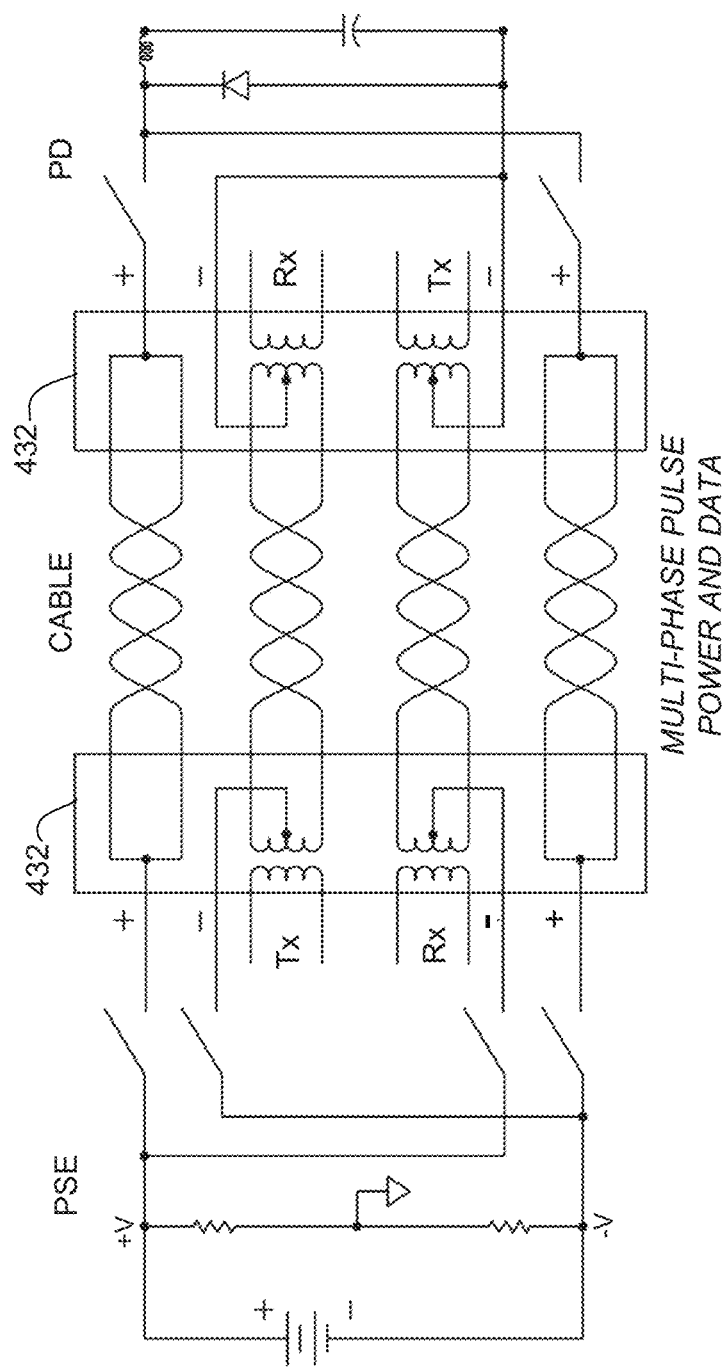
FIG. 21 illustrates delivery of multi-phase pulse power and data in a Power over Ethernet system, in accordance with one embodiment.

FIG. 21 illustrates an example of a circuit for delivery of power at higher power levels than conventional PoE using multi-phase pulse power, in accordance with one embodiment. The PSE is coupled to the PD through a four-pair cable with connectors 432 (e.g., RJ-45 or modified RJ-45). A two-phase implementation with four pairs of wires and a center tap arrangement may have reduced individual pair currents and utilize existing PoE cable infrastructure. In one example 56V two-phase ESP may be used to provide approximately one and a half times more current and power than conventional PoE. In another example 112V two-phase ESP may be used to provide approximately three times more current and power than 56 VDC PoE. In yet another example, 150V 3-phase ESP provides approximately four times more current and power than 56 VDC PoE. As previously described, the cable may comprise any number of wires or wire pairs configured for delivering data, pulse power (e.g., ESP without communications), pulse power and data (e.g., ESP with communications as described herein), conventional PoE or PoDL, or any combination thereof. For example, the system may include four data channels rather than two data channels.

In one or more embodiments, a PLC (Power Line Communications) zero-timestamp may be used with pulse synchronization events for use in discovering network topologies (e.g., multi-drop in an ESP system). By triggering the PLC transceiver using pulse synchronization signals instead of the output from conventional zero-crossing detector circuits, PLC zero-crossing timestamps may be utilized in ESP systems. This allows hardware or software timestamping of transmitted and received messages, which can accurately establish when during a pulse period the timestamped event occurred. By collecting these timestamps, the order of network nodes and their relative distance may be established. If signal propagation characteristics are known or estimated at run time, this relative distance can be converted to an absolute distance. This provides transmitters in an ESP system with the capability to discover network topology with reasonable accuracy while re-using existing PLC transceiver features.

As can be observed from the foregoing, one or more embodiments provide for mitigation of corruption of data due to pulse edges during pulse power transitions with transmission of data and pulse power on a wire pair. Data may be transmitted while avoiding potential interference that may be caused by the pulse power that is coupled onto the same pair of wires transmitting the data. One or more embodiments may also provide improved power delivery with enhanced reliability and safety for high power operation. The multi-phase pulse power distribution described herein allows for higher power transmission with higher efficiency, lower EMC, and filter size/cost reduction using high voltage power transmission safely at a low installation and operational cost with improved efficiency.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A method comprising:
    transmitting pulse power on a first wire pair of a plurality of wire pairs, the pulse power comprising a plurality of power pulses;
    performing fault detection on the first wire pair between the power pulses; and
    transmitting data on a second wire pair of the plurality of wire pairs.

2. The method of claim 1, wherein the plurality of wire pairs are located in a multi-pair cable.

3. The method of claim 1, wherein a voltage of the power pulses comprises at least 60 volts.

4. The method of claim 1, wherein one period of a power pulse and the fault detection is less than or equal to 12 ms.

5. The method of claim 1, further comprising:
    transmitting on a third wire pair of the plurality of wire pairs, pulse power with data superimposed on the power pulses of the pulse power on the third wire pair.

6. The method of claim 1, wherein the power pulses comprise alternating on-time duration and off-time duration, including a high-state within the on-time duration and a low-state within the off-time duration, the method further comprising:
    identifying a transition from the low-state to the high-state in the power pulses on the first wire pair;
    superimposing a modulated data signal within the on-time duration, after a first delay of the transition from the low-state to the high-state to produce a superimposed sequence of pulses; and
    transmitting the superimposed sequence of pulses.

7. The method of claim 6, further comprising:
    identifying a transition from the high-state to the low-state in the power pulses; and
    superimposing the modulated data signal within the off-time duration, after a second delay of the transition from the high-state to the low-state.

8. The method of claim 6, wherein the modulated data signal is synchronized between a transmitter and a receiver based on the transition.

9. The method of claim 6, wherein the modulated data signal comprises a sinusoidal signal created based on a phase shift modulation scheme.

10. The method of claim 6, wherein the modulated data signal comprises a pulse signal, the pulse signal including a high-state involving an increase and a low-state involving a decrease.

11. The method of claim 1, wherein the pulse power is multiphase pulse power that comprises a plurality of sequences of power pulses, each sequence of power pulses forming a phase of the multiphase pulse power.

12. An apparatus comprising:
    a power supply;
    a controller coupled to the power supply; and
    a power transmitter coupled to the controller and to the power supply;
    wherein the controller is configured to configured to:
        control the power transmitter to transmit pulse power on a first wire pair of a plurality of wire pairs, the pulse power comprising a plurality of power pulses;
        perform fault detection on the first wire pair between the power pulses; and
        transmit data on a second wire pair of the plurality of wire pairs.

13. The apparatus of claim 12, wherein a phase of pulse power is carried on each of the plurality of wire pairs and the plurality of wire pairs are located in a multi-pair cable.

14. The apparatus of claim 12, wherein a voltage of the power pulses comprises at least 60 volts.

15. The apparatus of claim 12, wherein the controller is configured to suspend transmission of data by controlling a (Media Access Control)/PHY (Physical layer entity) to suspend data transmission.

16. The apparatus of claim 12, wherein the controller is further configured to control the power transmitter to transmit on a third wire pair of the plurality of wire pairs, pulse power with data superimposed on the power pulses of the pulse power on the third wire pair.

17. The apparatus of claim 12, wherein the power pulses comprise alternating on-time duration and off-time duration, including a high-state within the on-time duration and a low-state within the off-time duration, and the controller further:
    identifies a transition from the low-state to the high-state in the power pulses;

superimposes a modulated data signal within the on-time duration, after a first delay of the transition from the low-state to the high-state to produce a superimposed sequence of pulses; and causes the power transmitter to transmit the superimposed sequence of pulses.

18. The apparatus of claim 17, wherein the controller further:

identifies a transition from the high-state to the low-state in the power pulses; and superimposes the modulated data signal within the off-time duration, after a second delay of the transition from the high-state to the low-state.

19. The apparatus of claim 17, wherein the modulated data signal comprises a pulse signal, the pulse signal including a high-state incurring an increase and a low-state involving a voltage decrease.

20. The apparatus of claim 12, wherein the pulse power is multiphase pulse power that comprises a plurality of sequences of power pulses, each sequence of power pulses forming a phase of the multiphase pulse power.

\* \* \* \* \*